United States Patent [19]

Ishizuka et al.

[11] Patent Number: 5,531,834
[45] Date of Patent: Jul. 2, 1996

[54] PLASMA FILM FORMING METHOD AND APPARATUS AND PLASMA PROCESSING APPARATUS

[75] Inventors: Shuichi Ishizuka, Nirasaki; Kohei Kawamura; Jiro Hata, both of Yamanashi-ken; Akira Suzuki, Nirasaki, all of Japan

[73] Assignee: Tokyo Electron Kabushiki Kaisha, Tokyo, Japan

[21] Appl. No.: 273,878

[22] Filed: Jul. 12, 1994

[30] Foreign Application Priority Data

| | | | |
|---|---|---|---|
| Jul. 13, 1993 | [JP] | Japan | 5-195379 |
| Aug. 19, 1993 | [JP] | Japan | 5-226417 |
| Aug. 19, 1993 | [JP] | Japan | 5-226418 |
| Nov. 24, 1993 | [JP] | Japan | 5-317375 |
| Mar. 1, 1994 | [JP] | Japan | 6-056752 |

[51] Int. Cl.$^6$ .................................................. C23C 16/00
[52] U.S. Cl. ........................... 118/723 I; 118/723 MP; 118/723 E; 118/723 R; 156/345
[58] Field of Search ................. 118/723 R, 723 MP, 118/723 E, 723 ER, 723 I, 723 IR, 725, 724; 156/345; 204/298.26, 298.34, 298.37

[56] References Cited

U.S. PATENT DOCUMENTS

| | | | |
|---|---|---|---|
| 4,810,935 | 3/1989 | Boswell | 315/111.41 |
| 4,828,369 | 5/1989 | Hotomi | 350/357 |
| 4,844,775 | 7/1989 | Keeble | 156/643 |
| 4,948,458 | 8/1990 | Ogle | 156/643 |
| 5,078,851 | 1/1992 | Nishibata | 204/298.34 |
| 5,122,251 | 6/1992 | Campbell | 204/298.06 |
| 5,280,154 | 1/1994 | Cuomo | 219/121.52 |
| 5,401,350 | 3/1995 | Patrick | 156/345 |

Primary Examiner—R. Bruce Breneman
Assistant Examiner—Joni Y. Chang
Attorney, Agent, or Firm—Beveridge, DeGrandi, Weilacher & Young

[57] ABSTRACT

A plasma film forming apparatus comprises gas supply means for feeding a processing gas into a processing chamber, a first electrode opposed to an object of processing in the processing chamber, a second electrode in the form of a flat coil facing the first electrode across the object of processing, pressure regulating means for keeping the pressure in the processing chamber at 0.1 Torr or below, heating means for heating the object of processing to a predetermined temperature, and application means for applying radio-frequency power between the first and second electrodes, whereby the processing gas is converted into a plasma such that a film is formed on the surface of the object of processing through reaction of ions or active seeds in the plasma. When radio-frequency power is applied between the pair of electrodes, a radio-frequency electric field is formed. Since one of the electrodes is the flat coil, however, a magnetic field is formed. As a result, the processing gas is converted into a plasma by electrical and magnetic energies. Accordingly, the processing gas can be changed into a plasma under low pressure, and a high-density plasma can be generated even under a pressure of 0.1 Torr or below. Thus, the efficiency of ion application to the surface of the object of processing is high, and the effect of impurity extraction is great.

10 Claims, 25 Drawing Sheets

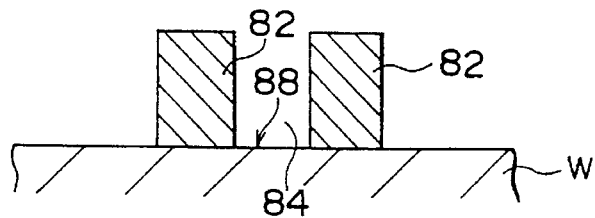
FIG. 40A
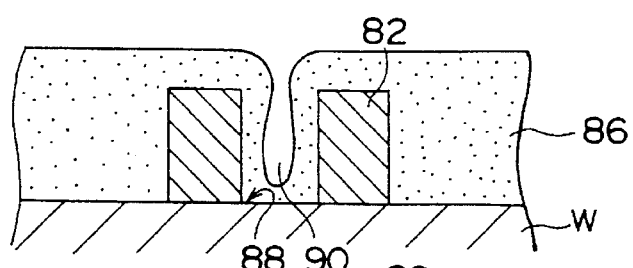
FIG. 40B
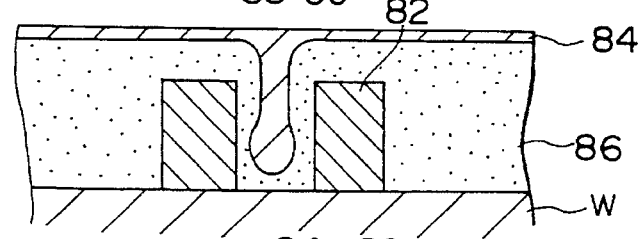
FIG. 40C
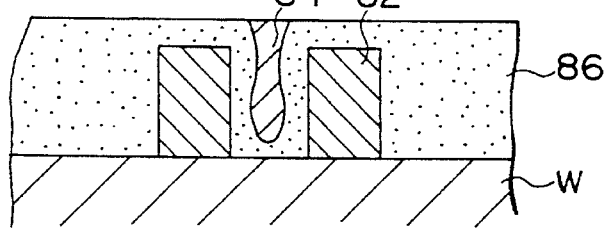
FIG. 40D
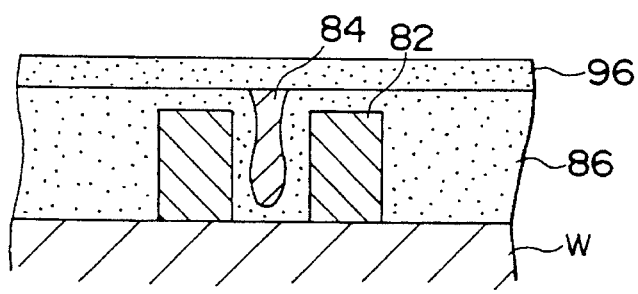
FIG. 40E
FIG. 41
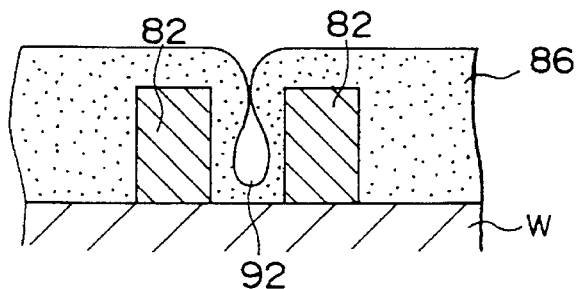

PLASMA FILM FORMING METHOD AND APPARATUS AND PLASMA PROCESSING APPARATUS

BACKGROUND OF THE INVENTION

1. Field of the Invention

The present invention relates to a plasma film forming method and apparatus and a plasma processing apparatus.

2. Description of the Related Art

With the development of higher-integration semiconductor devices, the circuit configurations of the devices have become more complicated with respect to three-dimensional directions. Accordingly, superfine circuits with half-micron- or submicron-order pattern widths are expected to have a multilayer structure. In this circumstance, multilayer wiring is a very important technique which affects the performance and function of the devices.

In silicon oxide films for use as layer insulating films which constitute multilayer wires, water released from the films causes corrosion of aluminum wires, reduction of pressure resistance between the aluminum wires, etc. Therefore, the plasma CVD method is a suitable method for forming a silicon oxide film which contains less water.

The following is a description of a case in which a silicon oxide film is formed by the plasma CVD method. An organic silicon source, e.g., a combination of TEOS (tetraethyl orthosilicate) and oxygen gas ($O_2$ gas), is introduced into a CVD apparatus of the parallel flat plate type. As a result, a plasma is generated to form a film. In the CVD apparatus of this type, the processing gases are introduced into an airtight processing chamber which is provided with an electrode, doubling as a wafer mount, and an opposite electrode opposed thereto in parallel relation. A radio-frequency (RF) electric field is generated between these electrodes, and the processing gases are converted into a plasma. At the same time, a wafer is heated by means of a heater which is contained in the wafer mount, whereby the processing gases are decomposed. Thus, the filicon oxide film is formed.

The silicon oxide film (hereinafter referred to as P-TEOS film), thus formed by the plasma CVD method using TEOS, contains very little water. However, this film is subject to a drawback that the filling configuration of depressions is awkward.

As the capacity of DRAMs increases, 64M, 256M, and 1 G, wiring gap patterns are reduced to superfine versions of 0.35 μm, 0.25 μm, and 0.13 μm. It is difficult for some CVD apparatuses of the parallel flat plate type to fill the depressions of these superfine patterns without producing voids.

Conventionally, therefore, the depressions are first filled with a P-TEOS film 11 which has good insulating properties, as shown in FIG. 16. In order to secure the surface levelness, moreover, SOG (spin-on-glass) 12 is applied to the resulting structure. In order to seal the SOG 12, furthermore, another P-TEOS film 11 is formed thereon. A TiN film 13 is formed to separate upper and lower wiring structures.

The depressions may be filled to some degree with the P-TEOS film, and thereafter, instead of applying the above method applying the SOG, an alternative method is investigated such that the depressions are filled by forming a silicon oxide film ($TEOS-O_3$ film) by the hot CVD method using TEOS and ozone. Although the $TEOS-O_3$ film contains much water, its filling configuration is good enough. The method using this film, therefore, is an effective method.

In this method for forming the plasma CVD film, ions in a plasma serve to remove impurities, thereby restraining the impurities from being caught in the film. In forming a P-TEOS film, for example, carbon (C) and hydroxyl groups (OH) are produced and confined as impurities to the P-TEOS film as TEOS is decomposed to form a film on a wafer. As these impurities get hit by oxygen ions in the plasma, however, they are separated in the form of carbon dioxide or water molecules from the film, and are discharged from the system.

In the conventional CVD apparatus of the parallel flat plate type, however, if radio-frequency power is set within a range such that it exerts no bad influence on the wafer surface, electric discharge cannot occur unless the total gas pressure during plasma generation is as high as about 1 Torr or at some $10^{-1}$ Torr at the least. Therefore, the probability of generated ions in a gas phase to run against one another is so high that the ions are coupled again into gas molecules, and the plasma density is as low as about $1\times10^{10}/cm^3$. Accordingly, the ions are few, and the efficiency of ion application to the wafer surface is poor.

As a result, the effect of removal of impurities is small, the film quality is poor, and corrosion of the aluminum wires is accelerated. In consequence, the P-TEOS film is so thin that current leakage and reduction of pressure resistance between the wires are liable to be caused. Thus, the reliability of the devices is lowered.

In order to improve the efficiency of ion application to the wafer surface, it is effective to use an ECR plasma source which can enjoy a high plasma density of about $1\times10^{12}/cm^3$. However, an ECR plasma apparatus, which requires use of a large-sized magnet and the like, entails high costs on account of its construction.

In the CVD apparatus of the parallel flat plate type, as described above, the gas pressure must be relatively high. Accordingly, there are many particles in the processing chamber, and $SiO_2$ and impurities adhere to the inner wall of the processing chamber. In consequence, washing operation must be performed at high frequency, e.g., with every cycle of film formation, thus lowering the throughput.

The SOG, which contains many OH groups, provides a poor film quality, resulting in corrosion or cracking of aluminum and stress migration. If the SOG is applied, then it requires processes for baking, application, and sintering, and besides, repeated execution of P-TEOS film formation, thus entailing an increase in the number of processes of operation. This problem also applies to the case where the $TEOS-O_3$ film is used.

SUMMARY OF THE INVENTION

An object of the present invention is to provide a plasma film forming method and apparatus, capable of obtaining a high-density plasma even when the pressure of processing gases is low, so that a high-quality film with a satisfactory filling property can be formed.

Another object of the invention is to provide a plasma processing apparatus capable of generating a plasma even under low pressure.

In a first aspect of the invention, a plasma film forming apparatus comprises; gas supply means for feeding a processing gas into an airtight a processing chamber; a first electrode supporting an object of processing in the processing chamber; a second electrode, in the form of a flat coil, facing the first electrode across the object of processing; pressure regulating means for keeping the pressure in the processing chamber at 0.1 Torr or below; heating means for heating the object of processing to a predetermined temperature; and application means for applying radio-frequency power between the first and second electrodes, the processing gas being converted into a plasma such that a film is formed on the surface of the object of processing through reaction of ions or active seeds in the plasma.

In this arrangement, a radio-frequency electric field is formed when radio-frequency power is applied between the pair of electrodes. Since one of the electrodes is the flat coil, however, a magnetic field is formed. As a result, the processing gas is converted into a plasma by electrical and magnetic energies. Accordingly, the processing gas can be changed into a plasma under low pressure, and a high-density plasma can be generated even under a pressure of 0.1 Torr or below. Thus, the efficiency of ion application to the surface of the object of processing is high, and the effect of impurity extraction is great.

In a second aspect of the invention, moreover, a plasma film forming apparatus comprises: gas supply means for feeding a processing gas into an airtight processing chamber; a mount for carrying an object of processing in the processing chamber; induction means opposed to the mount; pressure regulating means for keeping the pressure in the processing chamber at 0.1 Torr or below; heating means for heating the object of processing to a predetermined temperature; and radio-frequency current supply means for supplying a radio-frequency current to the induction means to form an electromagnetic field in the processing chamber, whereby the processing gas is converted into a plasma such that a film is formed on the surface of the object of processing through reaction of ions or active seeds in the plasma.

When the radio-frequency current is supplied to the induction means, according to this arrangement, the electromagnetic field is formed in the processing chamber, and electrons flowing in the electromagnetic field space run against neutral particles in the processing gas, thereby forming a plasma. Accordingly, the processing gas can be changed into a plasma under low pressure, and a high-density plasma can be generated even under a pressure of 0.1 Torr or below. Thus, the efficiency of ion application to the surface of the object of processing is high, and the effect of impurity extraction is great.

In a third aspect of the invention, furthermore, a plasma processing apparatus comprises: a mount for carrying an object of processing in an airtight processing chamber; a flat coil opposed to the mount and having one end open; and application means for applying radio-frequency power between the other end of the coil and the mount or a container in the processing chamber, a plasma being generated such that plasma processing is effected through reaction of ions or active seeds in the plasma.

When a radio-frequency voltage is applied to the flat spiral coil, according to this arrangement, a plasma is generated in the processing chamber by the agency of radio waves from the coil and an electric field between the coil and the processing chamber. This plasma is generated even under a pressure of $1\times10^{-3}$ Torr or below, so that the directional property for etching, for example, can be improved.

In a fourth aspect of the invention, the plasma processing apparatus further comprises plasma density increasing means outside the outer wall of the processing chamber for increasing the density of the plasma in the processing chamber.

According to this arrangement, the plasma density increasing means is designed so that a plasma is produced as a supplement or confined by the effect of an electric or magnetic field generated thereby, whereby the plasma density in the processing chamber can be increased. Thus, a high-density plasma can be generated even in a high vacuum of $1\times10^{-3}$ or below, e.g., $1\times10^{-6}$ Torr.

In a plasma film forming method according to a fifth aspect of the invention, a process for applying a radio-frequency power includes a process for forming a film in a depression of the object of processing to fill the depression by plasma film formation, and a process for subjecting the surface of the film in the depression to ion sputtering.

According to this arrangement, plasma film formation can be achieved even under a pressure lower than, e.g., $1\times10^{-2}$ Torr. Therefore, ions and the like scatter very little, so that the film is deposited thick on the bottom portion of the depression and thin on the side wall of the depression. Thus, the depression is entirely filled with $P-SiO_2$.

Further, sputter film formation is also carried out with use of high-energy ions. Thereupon, the surface of a $P-SiO_2$ film is smoothed into a substantially perfectly level surface. The depression is filled by film formation using the plasma generated in a vacuum, in a manner such that the film thickness on the wall of the depression is greater than that on the bottom portion. Thereafter, the depression can be leveled by sputtering. In the case of a layer insulating film, in particular, this leveling effect obviates the necessity of use of the poor-quality SOG film has conventionally been required. Thus, the film quality can be greatly improved, that is, a layer insulating film with excellent insulating properties can be formed without involving the drawback of the SOG film.

Since the processes for forming and cutting the SOG film can be omitted, moreover, the number of manufacturing processes can be reduced, ensuring improvement of the throughput as well as a considerable reduction of costs.

BRIEF DESCRIPTION OF THE DRAWINGS

FIGS. 40A, 40B, 40C, 40D and 40E are diagrams for illustrating a conventional semiconductor film forming method;

FIG. 41 is a diagram illustrating a void produced during semiconductor film formation;

DETAILED DESCRIPTION OF THE PREFERRED EMBODIMENTS

Referring now to FIGS. 1 to 5, a plasma film forming method and apparatus according to a first embodiment of the present invention will be described.

Figure 1:
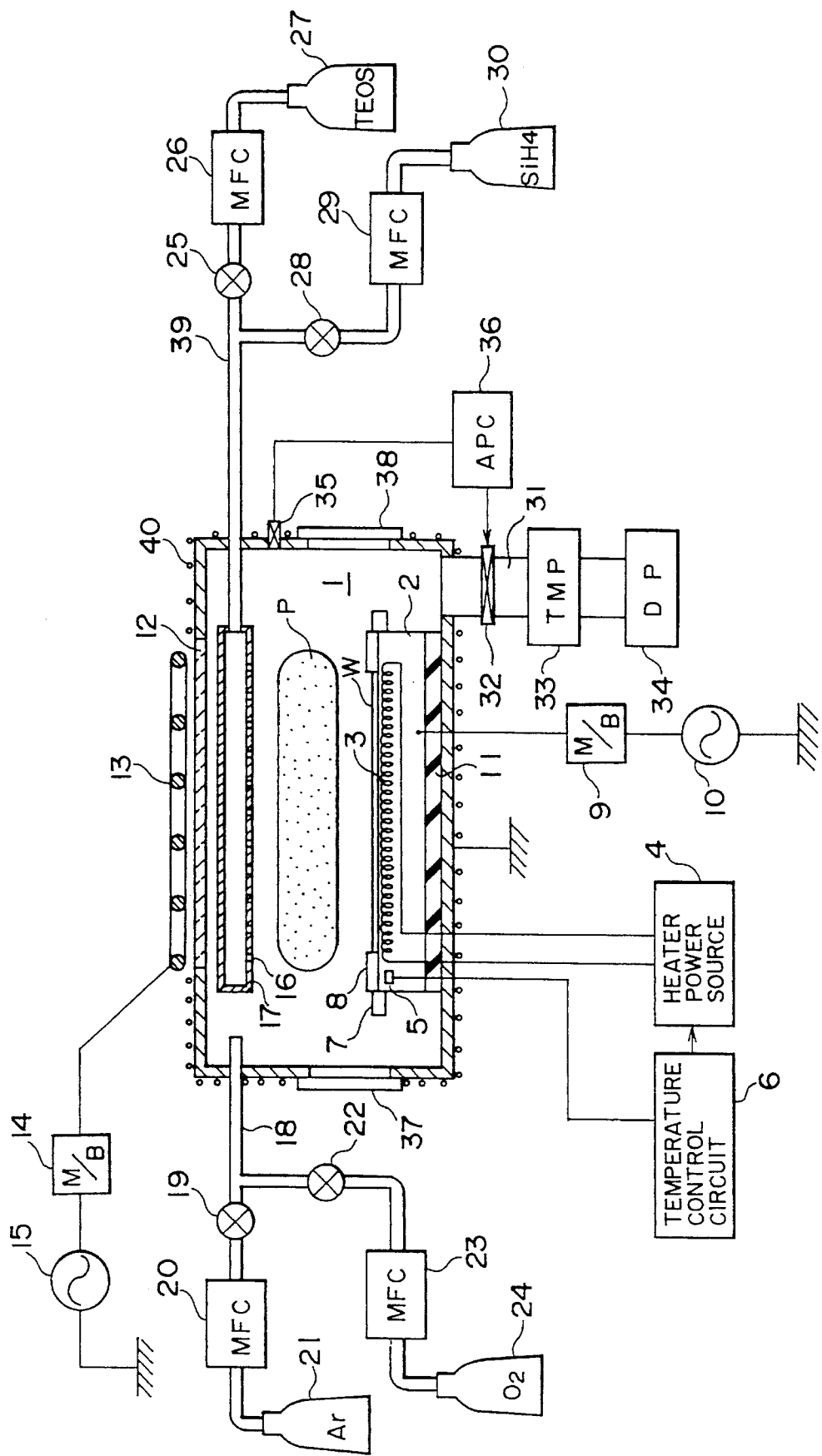
FIG. 1 is a schematic sectional view showing a plasma film forming apparatus according to a first embodiment of the present invention.

FIG. 1 is a view showing an example of a CVD apparatus according to the present invention. In FIG. 1, numeral 1 denotes an airtight processing chamber formed of, e.g., stainless steel. A wafer mount 2, which doubles as an electrode, is located in the center of the bottom portion of the processing chamber 1. Arranged in the mount 2 is a heater 3 formed of a coated resistance heating wire for heating a wafer W as an object of processing to a predetermined temperature. Both ends of the heater 3 are connected to a heater power source 4. Also, a thermometer 5, e.g., a thermocouple, for measuring the temperature of the wafer W is disposed in the wafer mount 2. The thermometer 5 delivers a temperature detection signal to a temperature control circuit 6, which controls the temperature of the heater 3 in accordance with the delivered signal. Moreover, the mount 2 is provided with a baffle plate 7 which have holes of 3-mm diameter arranged at intervals of 3 mm, for example. Located inside the baffle plate 7 is a focusing ring 8 for dispersing plasma and collecting it toward the wafer W. The wafer W is placed in the center of the focusing ring 8.

The wafer mount 2 is connected to a radio-frequency (RF) power source 10, one end of which is grounded, through a matching circuit 9. An insulting member 11 is interposed between the mount 2 and the bottom wall of the processing chamber 1. The frequency of the radio-frequency power source 10 ranges from 50 kHz to 40 MHz.

Figure 2:
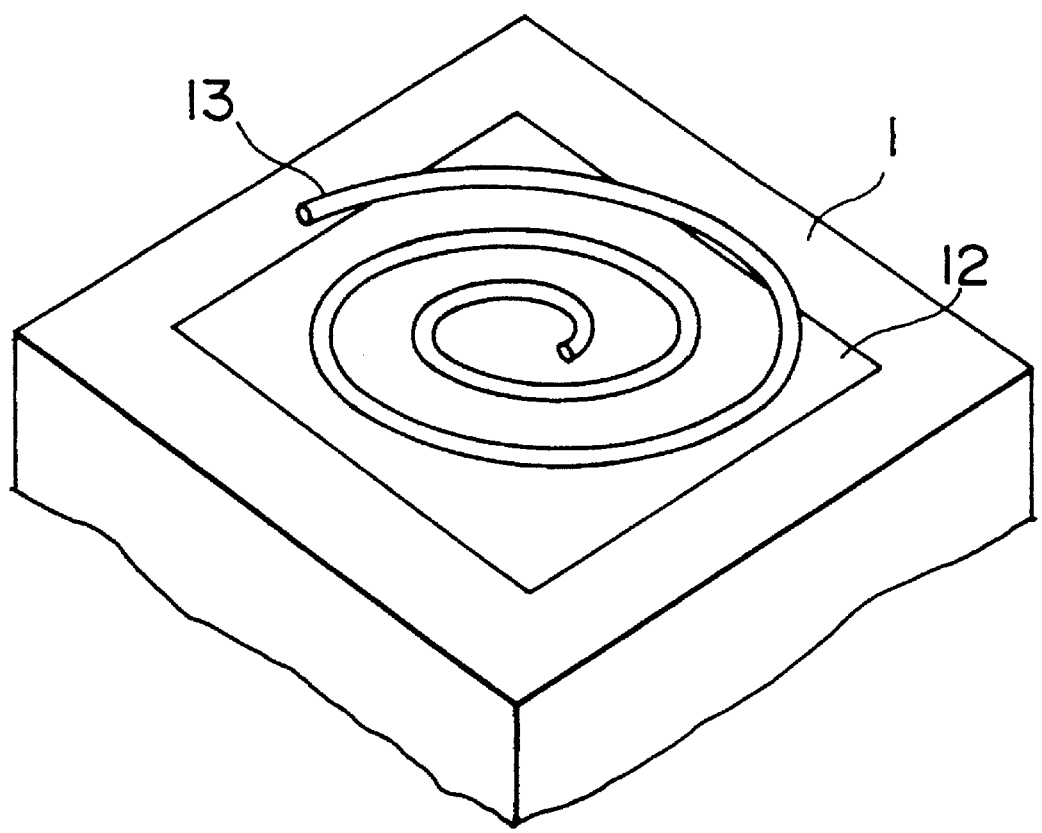
FIG. 2 is a schematic perspective view showing the principal part of the plasma film forming apparatus of FIG. 1.

The top wall portion of the processing chamber 1, which faces the wafer mount 2, is formed of, e.g., a quartz plate 12. An electrode 13 is located over the quartz plate 12 (outside the processing chamber 1) so as to face the plate 12. As shown in FIG. 2, the electrode 13 is a coil which is in the form of a plane spiral extending parallel to the wafer mount 2. The material of the electrode 13 is an electrically conductive metal or semiconductor, preferably copper. One end of the electrode 13 is grounded through a matching circuit 14 and a radio-frequency power source 15. The frequency of the power source 15 is adjusted to, for example, 1 MHz to 100 MHz, preferably 13.56 MHz. Thus, when radio-frequency power is applied between the electrode 13 and the mount 2, a magnetic field is formed between them.

The electrode (coil) 13 may be a hollow structure through which a coolant can be circulated so that the coil 13 can be restrained from heating. The diameter of the electrode or coil 13, which is greater than that of the wafer W, should preferably be just large enough to cover the wafer W. In this case, the plasma can be made more uniform.

According to the illustrated example, the coil 13 is placed directly on the quartz plate 12. Preferably, however, the coil 13 should be located at a distance from the plate 12. In this case, the quartz plate 12, a dielectric, is liable to less sputtering, and can be prevented from being cracked by heat.

A processing gas inlet portion or shower head 17, having gas jets 16 on the underside, for example, is disposed opposite the mount 2 in the processing chamber 1. The shower head 17 is formed of, e.g., a dielectric, such as ceramics, which can transmit a magnetic field. A gas inlet pipe 39 is connected to the head 17. A tank 27 containing, e.g., TEOS is connected to the inlet pipe 39 through a valve 25 and a mass-flow controller 26, while a tank 30 containing, e.g., $SiH_4$ is connected to the pipe 18 through a valve 28 and a mass-flow controller 29. A gas inlet pipe 18 is arranged having its nozzle opening into the processing chamber 1, and a tank 21 containing, e.g., Ar is connected to the inlet pipe 18 through a valve 19 and a mass-flow controller 20. Also, a tank 24 containing, e.g., $O_2$ is connected to the pipe 18 through a valve 22 and a mass-flow controller 23.

Although the gases are post-mixed in the illustrated example, it may alternatively be premixed.

An exhaust pipe 31 for evacuating the processing chamber 1 is connected to the bottom portion of the chamber 1. A gate valve 32 is attached to the pipe 31. Also, the exhaust pipe 31 is provided with a turbo-molecular pump 33 for evacuation to $10^{-6}$ Torr or above and a dry pump 34 for evacuation to $10^{-3}$ Torr or above. A pressure sensor 35 is attached to the side wall of the processing chamber 1, and an output signal from the sensor 35 is delivered to an automatic pressure controller 36. The pressure controller 36 serves to control the pumps 33 and 34 so as to keep the interior of the processing chamber 1 at a predetermined pressure. Gate valves 37 and 38 are attached to the side wall of the chamber 1. The valves 37 and 38 serve to open and close the chamber 1 for communication with a load locking chamber (not shown). Healing or cooling means 40 for controlling the temperature of the wall surface of the processing chamber 1 is arranged all over the wall surface. The means 40 serves to prevent a film, impurities, etc. from adhering to the inner wall surface.

The following is a description of a first embodiment of a plasma film forming method using the apparatus described above.

First, the wafer W is introduced from the load locking chamber into the processing chamber 1 and placed on the mount 2. The wafer W is heated to, e.g., 300° to 400° C. by means for the heater 3, and the chamber 1 is evacuated to a pressure of, e.g., $10^{-7}$ Torr by means of the turbo-molecular pump 33 and the dry pump 34.

Subsequently, processing gases, such as a gas containing TEOS and $O_2$ gas, are introduced at flow rates of 10 and 50 SCCM, respectively, through the gas inlet pipes 18 and 39 into the processing chamber 1. The pressure in the chamber 1 is kept at 0.1 Torr or below, e.g., at $1\times10^{-2}$ Torr, and the radio-frequency power sources 10 and 15 are individually operated at a frequency of 13.56 MHz and power level of 200 watts. As a result, a radio-frequency magnetic field is generated between the electrode 13 and the wafer mount 2. The electrode 13 is a flat spiral coil extending parallel to the mount (electrode) 2. Accordingly, lines of magnetic force run vertically, and a uniform magnetic field is formed in a plane parallel to the electrode 13 in the processing chamber 1.

Figure 16:
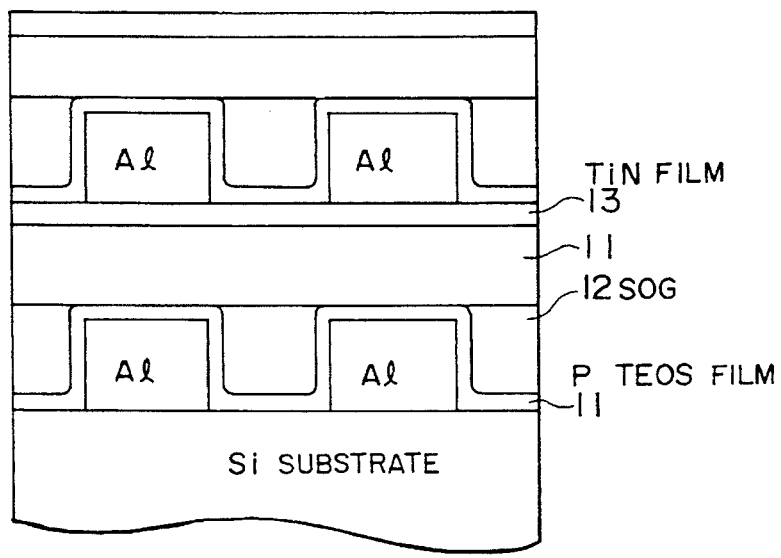
FIG. 16 is a diagram for illustrating an example of a multilayer insulating film.

In consequence, the TEOS and $O_2$ gases are discharged by the energy of the magnetic field, besides the energy of an electric field. Thus, plasma P with a high density of about $1\times10^{12}/cm^3$, for example, is formed. As active seeds in the plasma P react, a P-TEOS film (silicon oxide film) is formed as, for example, an insulating film of 2,000-angstrom thickness in a depression of the wafer W. Thereafter, the wafer W having the P-TEOS film thereon is coated with a laminate of a TEOS-$O_3$ film and a P-TEOS film, for example, thus forming a three-layer insulating film. (This arrangement is an equivalent modification of the arrangement of FIG. 16 in which the TEOS-$O_3$ film is formed in place of the SOG film.)

The pressure in the processing chamber 1 during this film formation is at $10^{-1}$ Torr or below, preferably ranging from $10^{-3}$ Torr to $10^{-1}$ Torr. This is because the film forming speed cannot be maintained under a pressure below $10^{-4}$ Torr, and anisotropic film formation cannot be easily effected under a pressure above $10^{-1}$ Torr. Preferably, the film forming speed is adjusted to 3000 angstroms/min.

According to this first embodiment, the electrode 13 is formed of a flat coil, whereby the magnetic field is formed in the processing chamber 1. Accordingly, electric power applied to the processing gases is adjusted to a level such that it exerts no bad influences upon the film formation. Moreover, the plasma P can be generated despite the gas pressure in the processing chamber 1 not higher than 0.1 Torr. Thus, the plasma density is as high as $1\times10^{11}/cm^3$ to $1\times10^{12}/cm^3$, which is higher by two or more figures than the value for the conventional CVD apparatus of the parallel flat plate type.

Accordingly, the efficiency of ion application to the wafer W is so high that impurities produced during the reaction of the processing gases, e.g., C and OH as decomposition products of TEOS, are carried away in the form of $CO_2$ and $H_2O$ by oxygen ions. Thus, impurities confined to the silicon oxide film are reduced, so that the silicon oxide film can enjoy good quality. Since the P-TEOS film (silicon oxide film) in the three-layer insulating film requires high insulating properties despite its extreme thinness, in particular, it is very effective to form it by means of the apparatus according to the first embodiment.

According to the first embodiment, moreover, it is unnecessary to use a large-sized magnet, such as an ECR apparatus. Accordingly, a thin film of good quality can be obtained with use of a simple structure without requiring a large-scale apparatus. Since the gas pressure in the processing chamber 1 is as low as $10^{-1}$ Torr, furthermore, there are few gas particles in the chamber 1. Thus, the silicon oxide film and impurities can be restrained from adhering to the inner wall of the processing chamber 1, so that the frequency of washing operation is lowered markedly.

Figure 3:
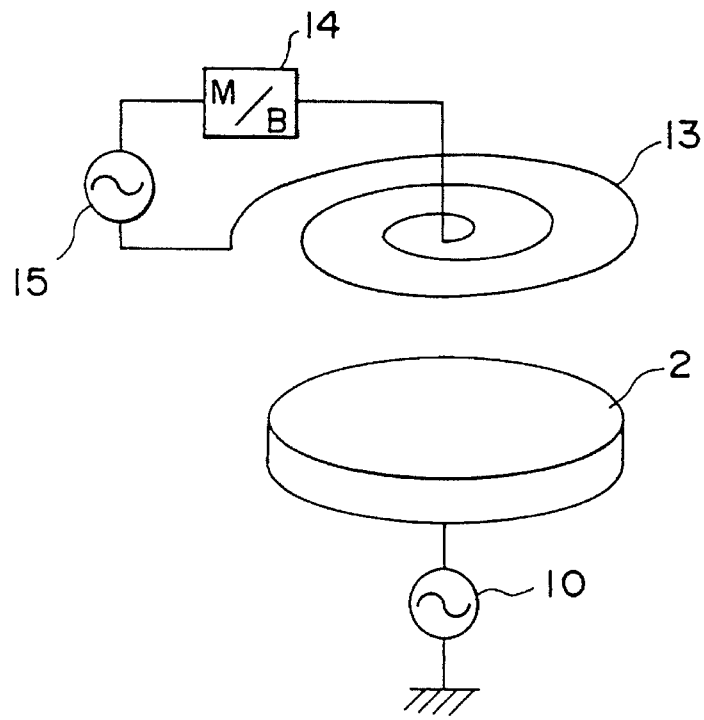
FIG. 3 is a diagram for illustrating another example of a radio-frequency power application system.
Figure 4:
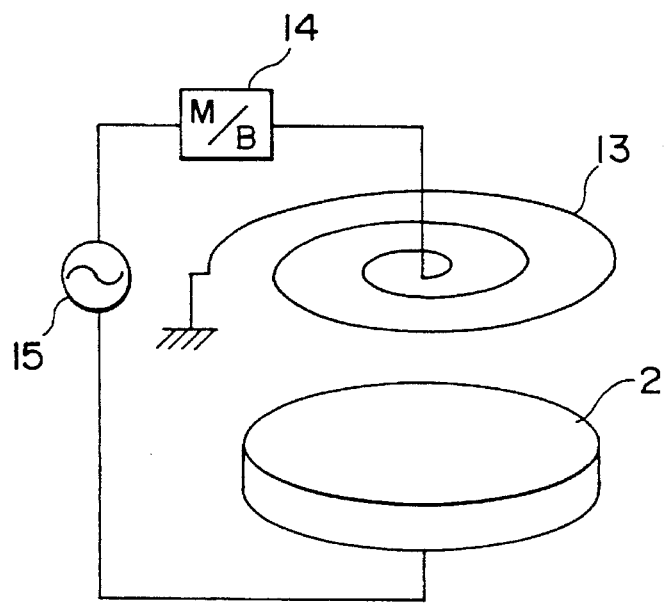
FIG. 4 is a diagram for illustrating still another example of the radio-frequency power application system.
Figure 5:
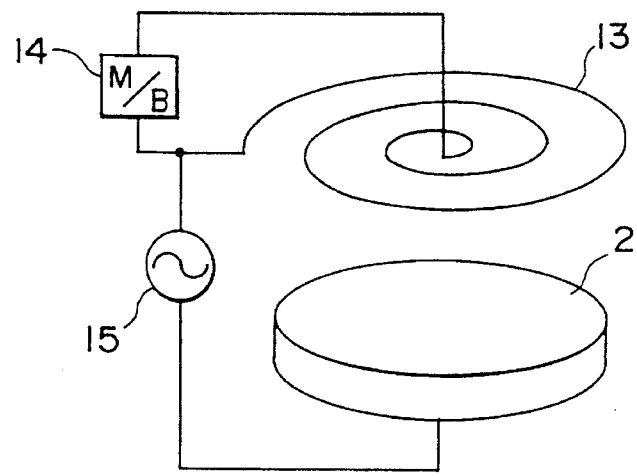
FIG. 5 is a diagram for illustrating a further example of the radio-frequency power application system.

According an example of system for applying radio-frequency power between the electrode (coil) 13 and the electrode (mount) 2, as shown in FIG. 3, the radio-frequency power source 15 is connected across the electrode 13, and the other radio-frequency power source 10 is connected between electrode (mount) 2 and the ground. According to another system, as shown in FIG. 4, one end of the electrode 13 is grounded, and the radio-frequency power source 15 is connected between the other end of the electrode 13 and the electrode 2. As shown in FIG. 5, moreover, there is a system in which the opposite ends of the electrode 13 are connected to each other, and the radio-frequency power source 15 is connected between the electrode 2 and a line of connection between the opposite ends of the electrode 13. Any of these systems may be used. When connecting the radio-frequency power sources 10 and 15 to the electrodes 13 and 2. respectively, the respective frequencies of the power sources 10 and 15 may be different from each other.

Referring now to FIGS. 6 to 15, a plasma film forming method and apparatus according to a second embodiment of the present invention will be described.

Figure 6:
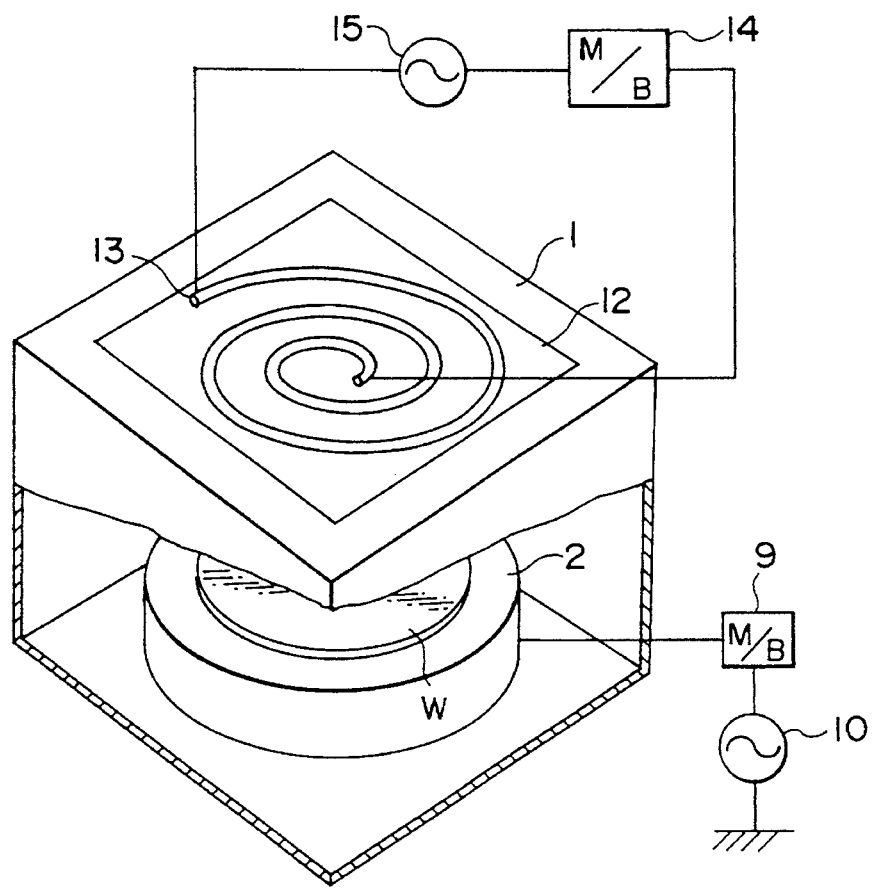
FIG. 6 is a schematic perspective view showing a plasma film forming apparatus according to a second embodiment of the invention.
Figure 7:
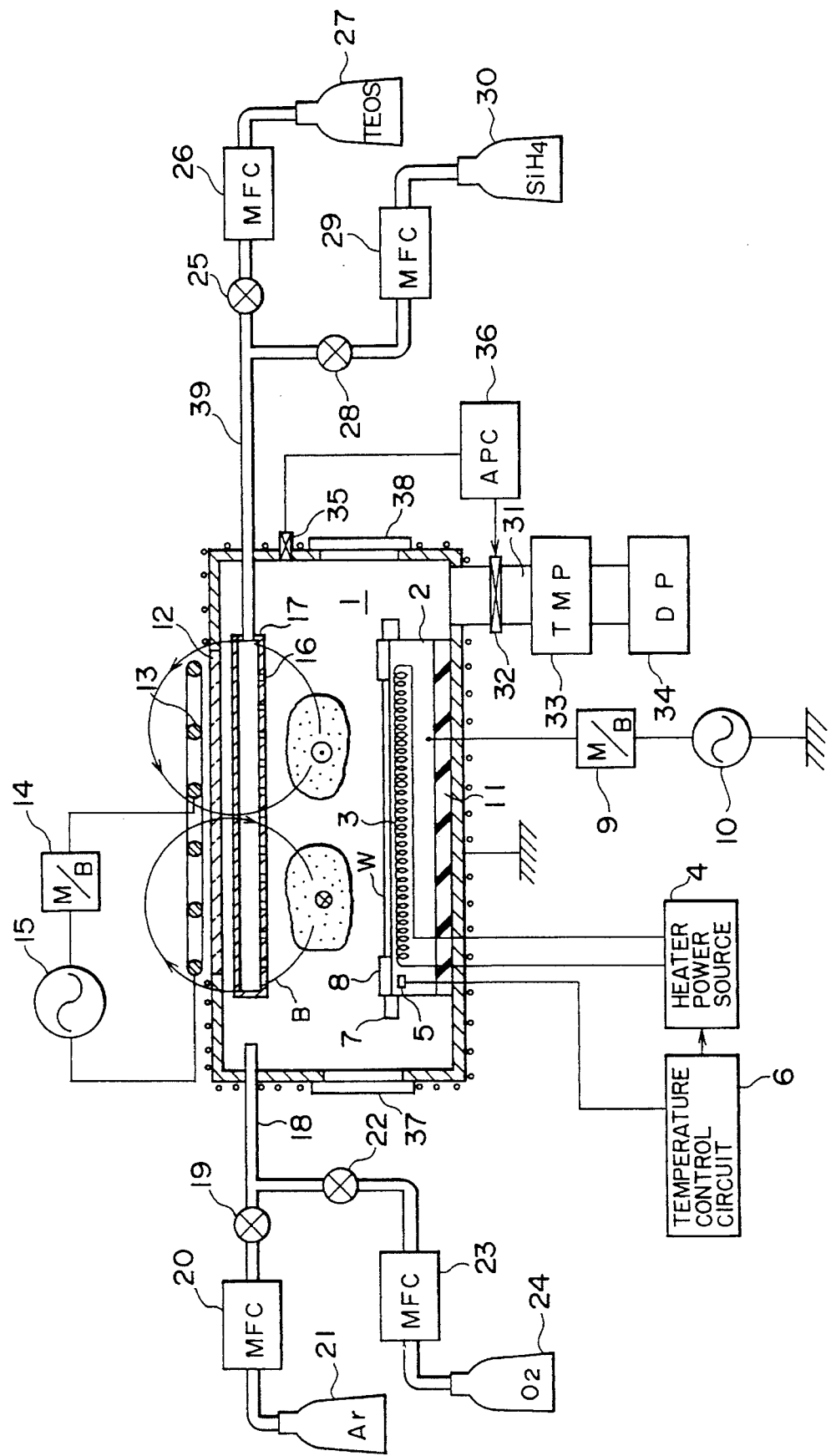
FIG. 7 is a sectional view showing the plasma film forming apparatus according to the second embodiment.

In the film forming apparatus according to this second embodiment, as shown in FIGS. 6 and 7, induction means, e.g., a spiral coil 13, is placed on a quartz plate 12 of a processing chamber 1. A radio-frequency power source 15 for the generation of a plasma is connected between the opposite terminals (inner and outer ends) of the coil 13 through a matching circuit 14. One end of a radio-frequency power source 10 for bias application is connected to a wafer mount 2 through a matching circuit 9, while the other end of the power source 10 is grounded. In FIGS. 1, 6 and 7, like reference numerals refer to like or corresponding portions.

A wafer W is placed on the mount 2, and is heated to, e.g., 300° to 400° C. by means of a heater 3. TEOS gas, $O_2$ gas, and Ar gas are fed into the processing chamber 1 at flow rates of, e.g., 1.5, 12, and 20 SCCM, respectively. The pressure in the processing chamber 1 is kept at 0.05 Torr. The radio-frequency power source 15 is operated at a frequency of 13.56 MHz and power level of 400 watts, and a radio-frequency current is caused to flow through the coil 13. The radio-frequency power source 10 is operated at a frequency ranging from 100 kHz to 2 MHz, e.g., at 400 kHz, and power level of 500 watts, and a bias current is applied to the wafer W.

Referring to FIG. 7 schematically showing the way of plasma generation, an alternating magnetic field B is generated around the coil 13. As a result, an alternating electric field A is induced substantially in a concentric circle right under the coil 13. The electric field E causes electrons accelerated in the circumferential direction of the processing chamber 1 to run against the aforesaid gases, thereby forming the plasma. Also in this case, energy given to the gases in the processing chamber 1 is adjusted to a level such that it exerts no bad influences upon the film formation as the plasma is generated under a low pressure of 0.1 Torr or below.

Figure 8A:
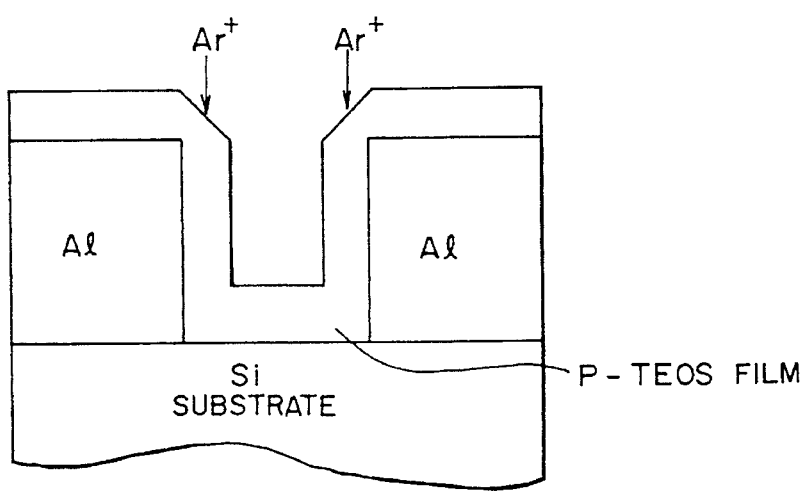
FIGS. 8A, 8B and 8C are diagrams for illustrating the way a depression is filled.
Figure 8B:
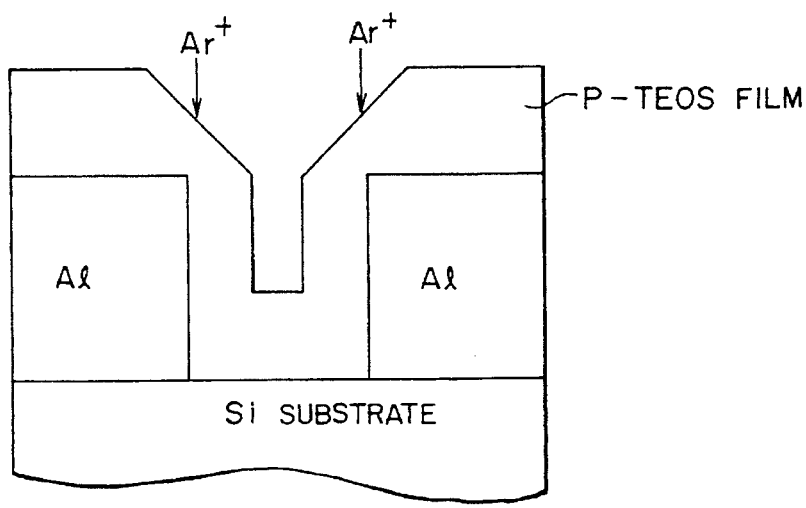
Figure 8C:
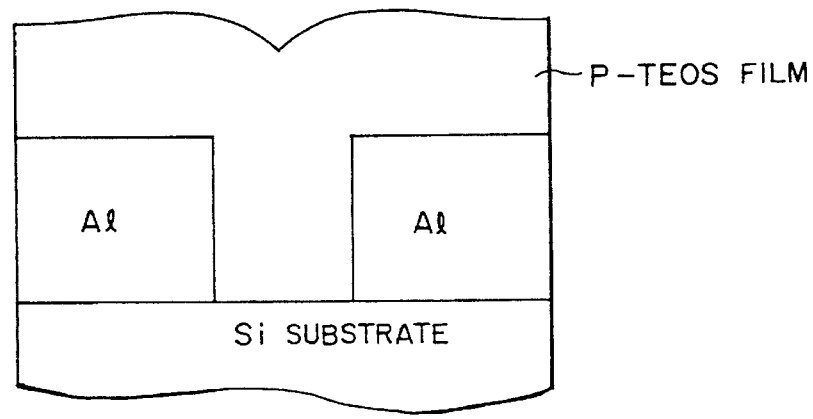

When a radio-frequency bias is applied to the wafer W, a circuit is formed from a loop including the wafer W, radio-frequency power source 10, wall portion of the processing chamber 1, plasma, and wafer W again. When the potential of the wafer W becomes negative, $Ar^-$ is led in toward the wafer W. Since the pressure in the processing chamber 1 is low, the directional properly of the ions, that is, the perpendicularity of the ions to the surface of the wafer W, is enhanced. When the Ar gas is converted into a plasma, a silicon oxide film (P-TEOS film) is formed in a depression (e.g., hollow between aluminum wires) in a manner such that $Ar^-$ chamfers the edges of the depression, as shown in FIGS. 8A to 8C. Accordingly, the opening of the depression can be prevented from being closed, so that filling can be achieved without involving a void.

In the conventional plasma apparatus of the parallel flat plate type, in contrast with this, the pressure cannot be as low as the one obtained with use of the coil 13, and actually, is expected to be as high as about 0.3 Torr, for example. In this case, active seeds and gas particles in the plasma have so high a density that they scatter, and the direction of $Ar^-$ cannot be settled even though a bias is applied to the wafer. As is also evident from test results which will be mentioned later, therefore, the depression is filled through its opening, and a void is formed if the depression has a narrow width and a high aspect ratio (width/depth).

For the bias applied to the wafer W, however, the potential of the wafer W may be rendered negative by using a DC power source. As an inert gas to be introduced into the processing chamber 1, Ar gas can produce a great sputtering effect, since $Ar^-$ has a large ion diameter. However, any other inert gas may be introduced in place of Ar gas. Since $O^+$ produced by ionizing $O_2$ gas also has a sputtering effect, an inert gas need not always be used for the purpose.

Figure 9:
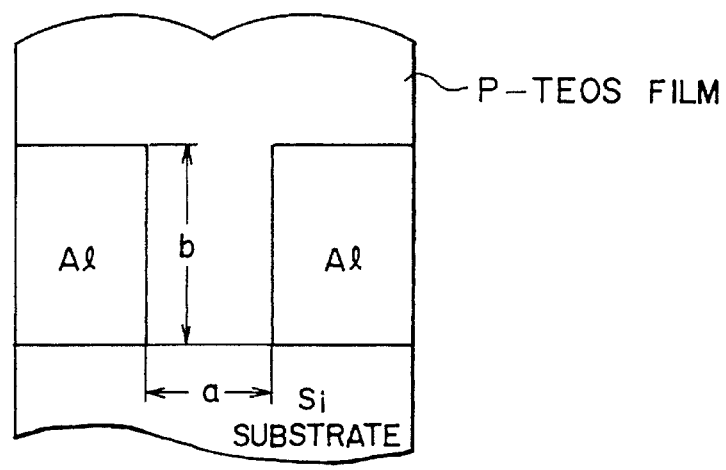
FIG. 9 is a diagram for illustrating a state in which the depression is filled.
Figure 10:
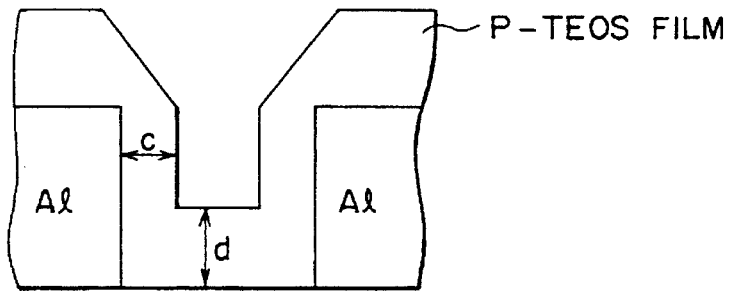
FIG. 10 is a diagram for illustrating indices for the degree of filling of the depression.

The following is a description of specific test results. Ten minutes of film formation was conducted in conditions including the flow rates of 1.5, 12, and 20 SCCM for TEOS gas, $O_2$ gas, and Ar gas, respectively, power and frequency of 400 watts and 13.56 MHz, respectively, for plasma generation, pressure of 0.05 Torr, gap of 7 cm between the coil 13 and the wafer W, and wafer temperature of 300° C. These processing conditions are referred to as "processing conditions A". As shown in FIG. 9, a depression with width a and depth b of 0.5 μm and 1.0 μm, respectively, was able to be filled satisfactorily without a void. Thus, it may be understood that this method is very effective for the formation of superfine layer insulating films of next-generation devices.

Further, film formation was effected in the same conditions as the conditions A except for the plasma generation power of 250 watts, pressure of 0.03 Torr, and gap of 8.5 cm between the coil 13 and the wafer W. Satisfactory filling was able to be achieved in like manner.

A void was produced when another film was formed in the same processing conditions A except for the pressure of 0.03 Torr and without any bias applied to the wafer (bias power= 0).

Figure 11:
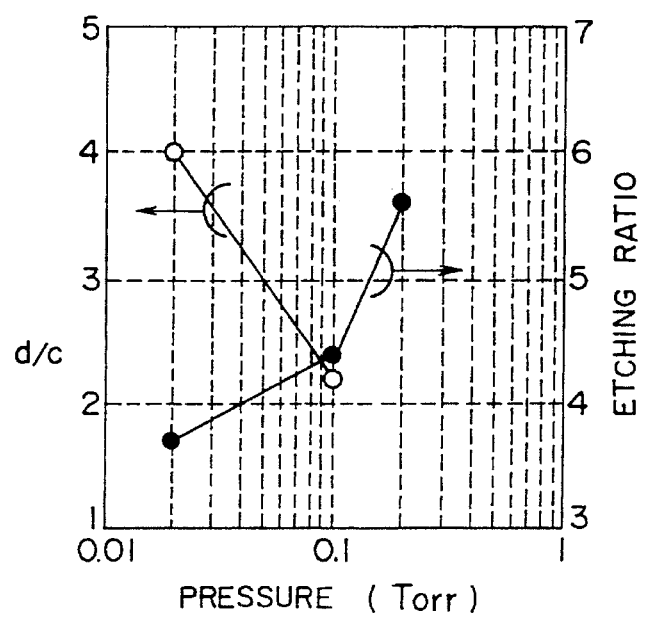
FIG. 11 shows characteristic curves illustrating the relationships between pressure and degree of filling and between pressure and etching speed ratio.

Further, the bias power was adjusted to 250 watts, and the pressure was set at three values, 0.02, 0.1, and 1 Torr. For the other requirements for the film formation, the processing conditions A were used. FIG. 11 shows the relationships between the pressure and etching speed ratio and between the pressure and d/c (degree of filling from the bottom) obtained in the middle of filling shown in FIG. 10. The etching speed ratio is a ratio which is represented by (etching speed of P-TEOS film)/(etching speed of thermal oxide film) obtained when wet etching is carried out by using 1-% dilute hydrofluoric acid, where the thermal oxide film is an oxide film formed by oxidizing silicon at about 1,000° C. The smaller this value, the closer to the thermal oxide film the resulting film is, that is, the less the impurities in the film arc.

If the pressure is 0.2 Torr, as seen from FIG. 11, the etching speed ratio is as high as 5.5 or more. If the pressure is 0.1 Torr or below, on the other hand, the speed ratio is lower than 4.5. Thus, it may be understood that an oxide film obtained with use of the pressure of 0.1 Torr or below can be of good quality. The value of d/c (degree of filling from the bottom) exceeds 2 under the pressure of 0.1 Torr or below. This substantiates the possibility of filling with a high aspect ratio.

Figure 12:
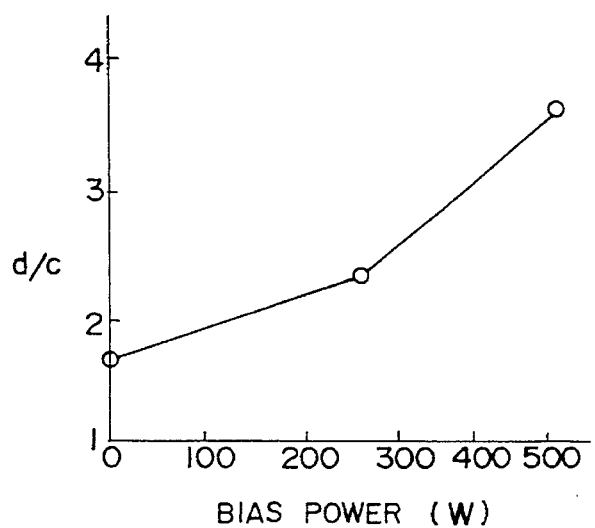
FIG. 12 shows a characteristic curve illustrating the relationship between bias power and degree of filling.

Thus, if the film formation is conducted under low pressure by using the coil 13, the efficiency of ion application to the wafer surface is high, as mentioned before. Accordingly, the impurities introduced into the silicon oxide film are reduced, so that the resulting oxide film can enjoy good quality. In order to fill a depression with a narrow pattern width and high aspect ratio (depth/width) satisfactorily, a bias must be applied to the wafer. FIG. 12 shows the result of examination of the value of d/c (see FIG. 10) obtained in the middle of filling in the same conditions as the processing conditions A except for the pressure of 0.02 Torr and with varying bias powers of 0, 250, and 500 W. This results substantiates the fact that the higher the applied bias, the higher the aspect ratio with which the depression can be filled is.

Figure 13:
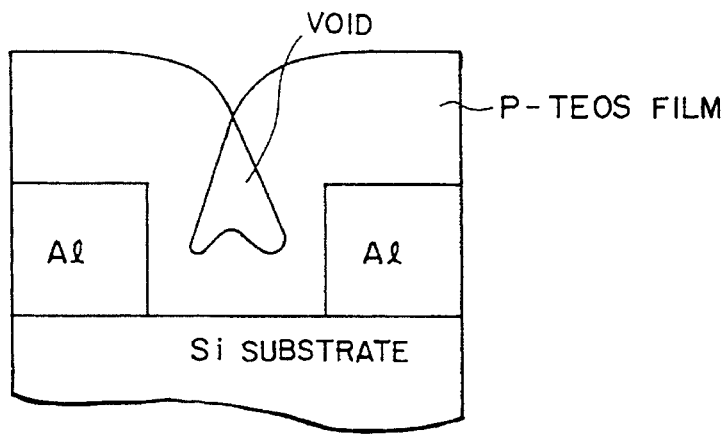
FIG. 13 is a diagram for illustrating a state in which the depression is filled by means of a plasma apparatus of the parallel flat plate type.

In a comparative test for comparison with the method of the second embodiment, moreover, a depression 0.8 µm deep and 0.8 µm wide was filled, as shown in FIG. 13, by means of a plasma apparatus of the parallel flat plate type, in conditions including the flow rates of TEOS gas and $N_2$ gas of 4 and 40 SCCM, respectively, applied power of 150 watts between the electrodes, frequency of 13.56 MHz, and pressure of 0.3 Torr. As a result, a void was formed, as shown in FIG. 13. FIGS. 9 and 13 are illustrative diagrams prepared on the basis of SEM photographs. Thus, according to the plasma apparatus of this type, a void would be formed even in the case of a depression with a pattern width of 0.8 µm and aspect ratio of 1. It is very difficult, therefore, to apply this apparatus to the formation of layer insulating films of next-generation devices.

Figure 14:
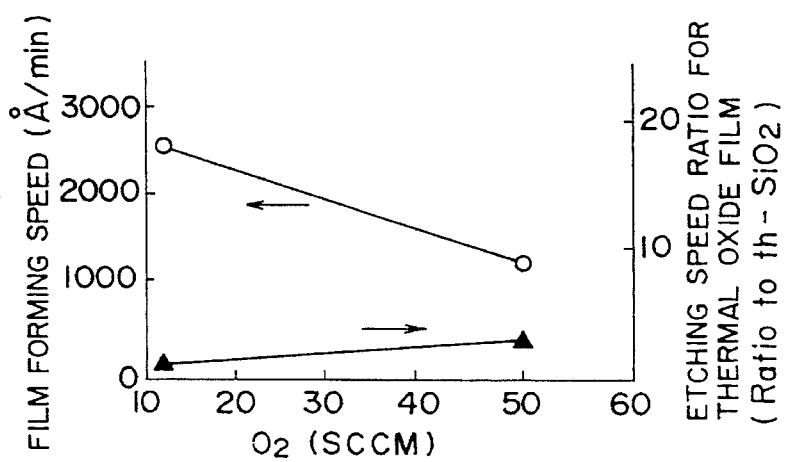
FIG. 14 shows characteristic curves representing film forming speed and film quality according to the first and second embodiments.

A silicon oxide film was formed in conditions including the power of 1,000 watts for plasma generation, bias power of 500 watts, pressure of 0.05 Torr, flow rates of 20 and 3 SCCM for Ar gas and TEOS gas, respectively, flow rates of 12 and 50 SCCM for $O_2$ gas, and gap of 5 cm. The speed of the film formation and the quality (etching speed ratio) of the resulting silicon oxide film were examined. FIG. 14 shows the results of this examination. These results indicate that the method of the second embodiment is fully applicable to the processing with respect to the film forming speed and film quality.

Figure 15A:
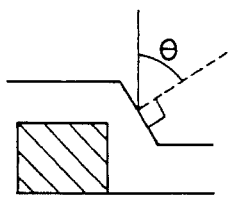
FIG. 15A is a diagram for illustrating an angle θ between a corner of the depression and a line perpendicular to the surface of a wafer.
Figure 15B:
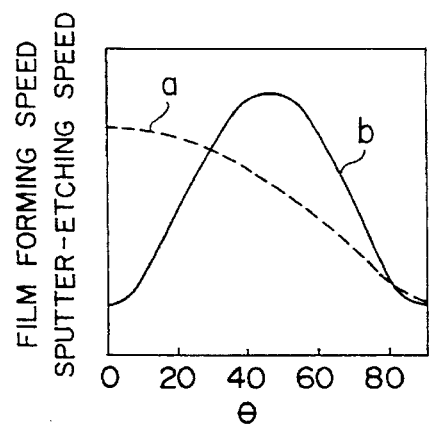
FIG. 15B is a diagram for illustrating the relationships between θ and film forming speed and between θ and sputter-etching speed.

FIG. 15A is a diagram showing an angle θ between a corner of a depression and a line perpendicular to the wafer surface. Curves a and b of FIG. 15B represent the relationships between the angle θ and the film forming speed and between the angle θ and the speed of etching by sputtering. When θ ranges from 45° to 50°, as seen from FIG. 15B, the etching speed has a maximum, and the depression can be filled without involving an overhang.

The coil 13 may be of a one-turn type, or may be coated with a material having a high surface corrosion resistance and located in the processing chamber 1. In the first embodiment shown in FIGS. 1 and 2, moreover, only the electrode 2 or both of the electrodes 13 and 2 may be formed of a coil each.

In forming a layer insulating film, according to the method described above, TMOS (tetramethyl orthosilicate), OMCTS (octamethylcyclotetrasiloxane), or TMCTS (tetramethylcyclotetrasiloxane) may, for example, be used in place of TEOS. Also, monosilane ($SiH_4$) may be used in place of an organic silicon source. Instead of using $O_2$ gas, moreover, ozone ($O_3$) gas may be used and caused to react to the organic silicon source. The first and second embodiments of the present invention are applicable to the formation of a layer insulating film or any other film than a silicon oxide film, e.g., a silicon nitride ($Si_3N_4$) film. The silicon nitride film can be obtained by causing a silane-based gas, such as dichlorosilane gas, to react to a gas, such as ammonia gas, which contains nitrogen.

Referring now to FIGS. 17 to 33, a plasma processing apparatus according to a third embodiment of the present invention will be described.

The plasma processing apparatus according to this third embodiment specifically corresponds to the plasma film forming apparatuses according to the first and second embodiments. In connection with the third embodiment, therefore, a repeated description will be omitted. Alternatively, this plasma processing apparatus may be an etching apparatus or the like.

A flat spiral coil (antenna member or electrode) 13 located on a quartz plate 12 is identical with those of the first and second embodiments. According to the third embodiment, a terminal 45 is attached to the outer end of the coil 13. A matching circuit 41 for impedance matching and a radio-frequency power source 42 of, e.g., 13.56 MHz for plasma generation are connected in series between the terminal 45 and a processing chamber 1. The other end of the power source 42 is connected to the chamber 1 or a susceptor 2 through a switch 43 or 44. In this arrangement, radio waves are emitted from the antenna member 13 toward the processing chamber 1. At the same time, an electric field is generated between the member 13 and the chamber 1 or the susceptor 2, whereby a plasma is generated in the chamber 1.

Thus, a circuit for plasma generation according to the third embodiment is formed by combining an inductive coupling based on the inductance of the antenna member 13 and a capacitive coupling between the member 13 and the processing chamber 1. Moreover, a shielding wire net (not shown) may be provided overlying and covering the antenna member 13 so that the radio waves are prevented thereby from leaking out.

The distance between the susceptor 2 and the quartz plate 12 is adjusted to about 100 cm or less, and the thickness and diameter of the plate 12 are adjusted to about 1 to 10 cm and to 100 cm or less, respectively. The maximum diameter of the antenna member 13 is set to be substantially equal to the diameter of the wafer W, ranging from 10 to 30 cm. The overall diameter of the member 13 may be larger or smaller than the wafer diameter, provided it allows the plasma to be generated.

A voltage applied to the susceptor 2 may be a radio-frequency voltage which is opposite in phase to radio-frequency power applied to the antenna member 13. Moreover, the potential of the susceptor 2 may be lowered to the ground level or rendered floating. Furthermore, a bias voltage of hundreds of kilovolts may be applied to the susceptor 2.

The following is a description of the third embodiment.

A vacuum is formed beforehand in the processing chamber 1, and processing gases are fed into the chamber 1 through a gas inlet pipe 18. The interior of the processing chamber 1 is kept under a rather low processing pressure of, e.g., about $1 \times 10^{-3}$ Torr. At the same time, radio-frequency power of, e.g., 13.56 MHz is applied between the antenna member 13 and the processing chamber 1. Thereupon, radio waves are emitted toward the chamber 1 by the inductive action of the inductance component of the antenna member 13. At the same time, an alternating electric field is generated in the processing chamber 1 by the agency of a capacitive component between the member 13 and the chamber 1. As a result, the processing gases are ionized to form a plasma in the processing chamber 1. Thus, the wafer surface can be etched with very high anisotropy by using active seeds produced by plasma discharge excitation, for example.

Figure 18:
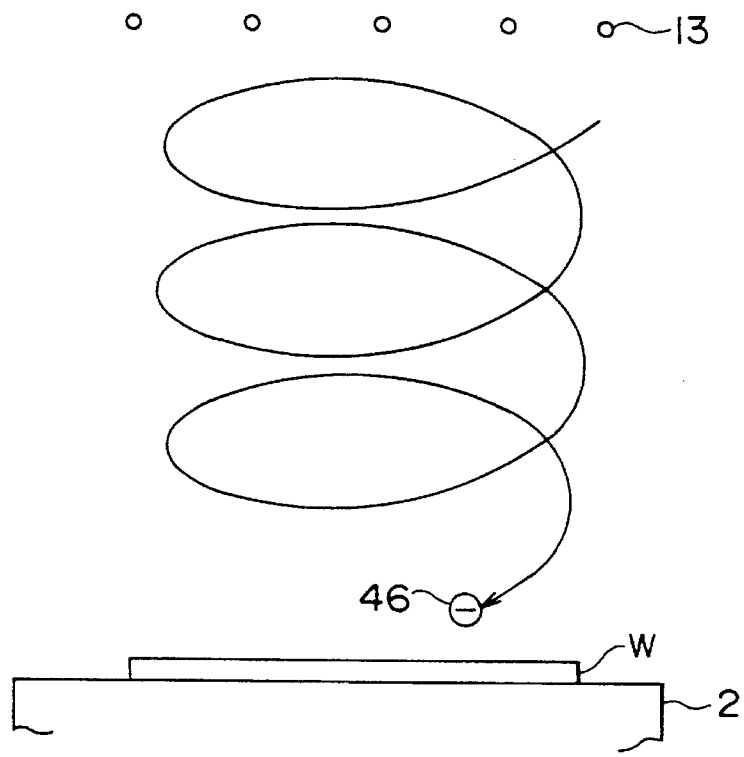
FIG. 18 is a diagram illustrating the movement of electrons and the like in a processing vessel of the apparatus shown in FIG. 17.

FIG. 18 schematically shows the movement of an electron or anion 46 in the processing chamber 1 in this state. The anion 46 moves toward the susceptor 2 while being turned in a spiral by the agency of the radio waves and the electric field. The distance the anion 46 can cover is longer than in the case of the conventional apparatus of the parallel flat plate type, and the anion 46 runs against gas particles to generate many ions during its movement. Thus, the etching rate, for example, can be improved correspondingly.

Since the plasma can be generated under a rather low pressure ranging from $1 \times 10^{-6}$ Torr to $1 \times 10^{-3}$ Torr, the active seeds scatter little and are uniformly oriented during the etching operation. Thus, highly anisotropic processing can be effected, and fine processing required by 64 and 256 megabit DRAMs, for example, can be carried out.

When the inductive coupling based on the inductance of the antenna member 13 and the cell coupling between the antenna member 13 and the processing chamber 1 were combined, as in the case of the present embodiment, a plasma was able to be actually generated even in an ultra-high vacuum of $1 \times 10^{-6}$ Torr.

The material, size, etc. of the antenna member 13 are not limited to the particulars of the third embodiment. FIGS. 19 to 26 show alternative antenna member which can be also employed suitably.

Figure 17:
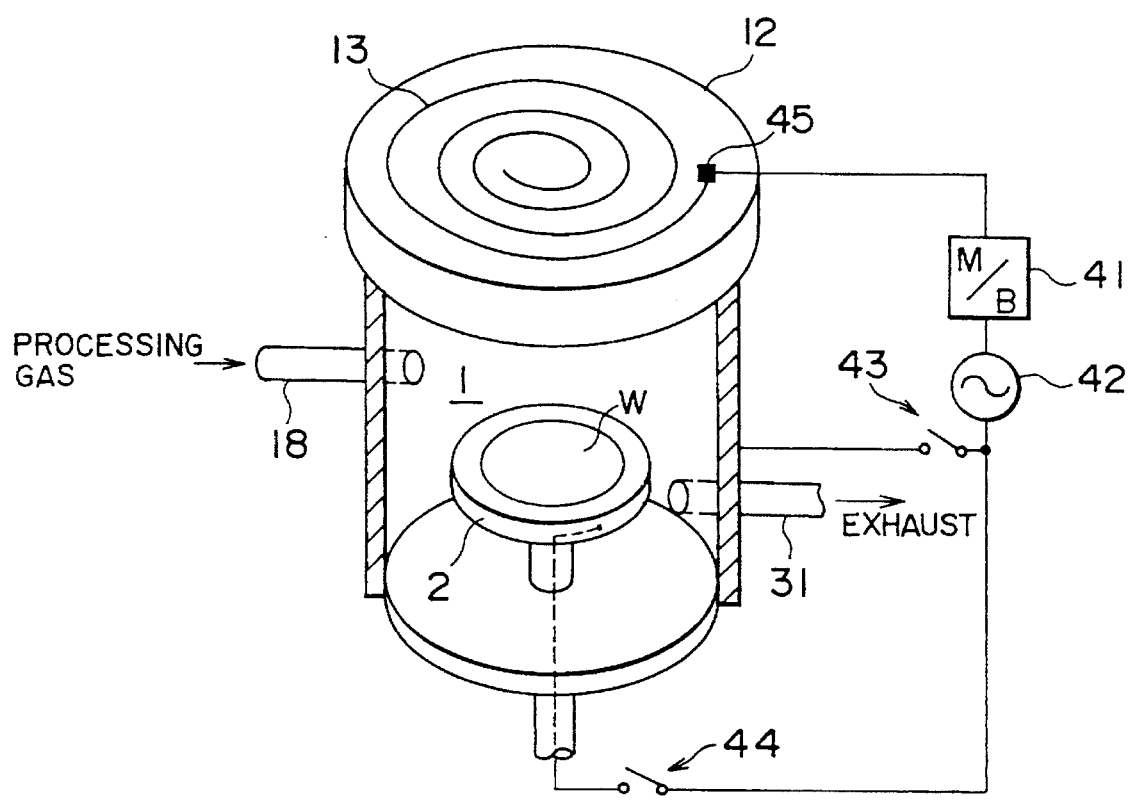
FIG. 17 is a schematic cutaway view showing a plasma processing apparatus according to a third embodiment of the present invention.
Figure 19:
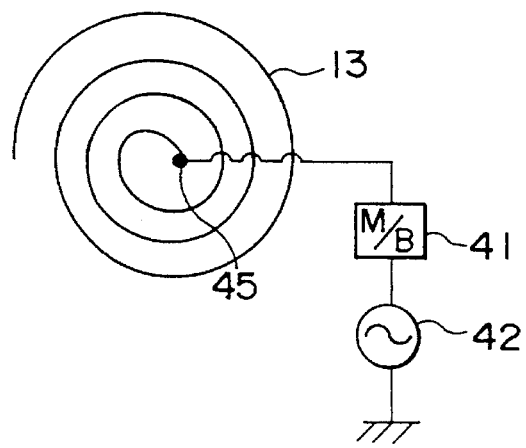
FIG. 19 is a plan view showing a first modification of an antenna member used in the third embodiment of the invention.

An antenna member 13 shown in FIG. 19, like the one shown in FIG. 17, is formed by spirally winding a wire. A terminal 45 is attached to the inner end of the antenna member 13, and a radio-frequency power source 42 for plasma generation is connected to the terminal 45.

Figure 20:
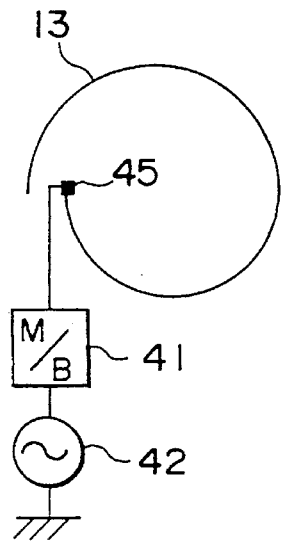
FIG. 20 is a plan view showing a second modification of the antenna member used in the third embodiment.

An antenna member 13 shown in FIG. 20, unlike the one shown in FIG. 19 which is formed by turning a wire a plurality of times, is in the form of a one-turn coil with a relatively large diameter, e.g., equivalent to the wafer diameter. A terminal 45 is attached to an end portion of the member 13.

Figure 21:
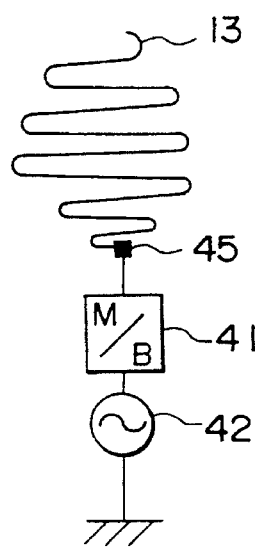
FIG. 21 is a plan view showing a third modification of the antenna member used in the third embodiment.

An antenna member 13 shown in FIG. 21 is formed by repeatedly folding a wire in a zigzag line. A terminal 45 is attached to an end portion of the member 13.

Figure 22:
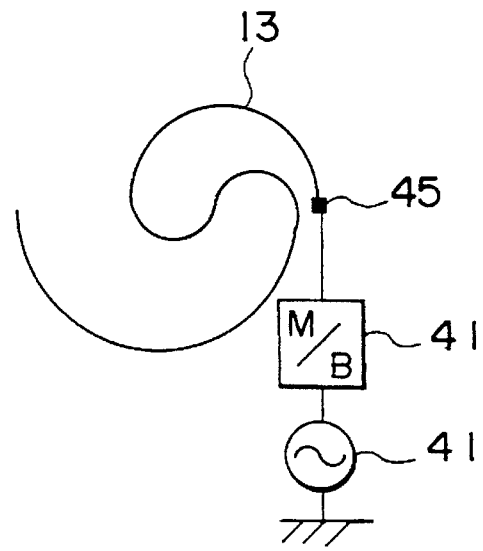
FIG. 22 is a plan view showing a fourth modification of the antenna member used in the third embodiment.

An antenna member 13 shown in FIG. 22 is formed by amorphously bending a relatively long wire. A terminal 45 is attached to an end portion of the member 13.

Figure 23:
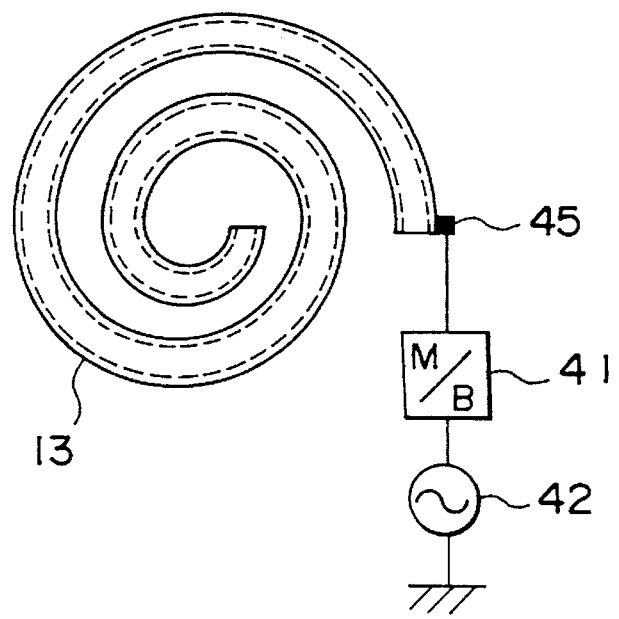
FIG. 23 is a plan view showing a fifth modification of the antenna member used in the third embodiment.

An antenna member 13 shown in FIG. 23 is formed by spirally winding a long hollow pipe of an electrically conductive material, such as steel or stainless steel. A terminal 45 is attached to an end portion of the member 13.

Figure 24:
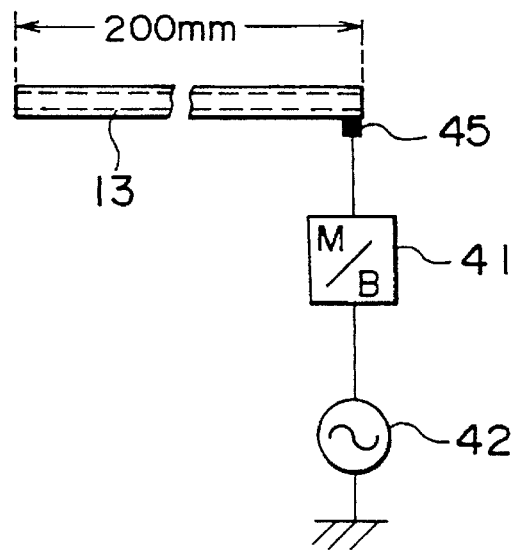
FIG. 24 is a plan view showing a sixth modification of the antenna member used in the third embodiment.

An antenna member 13 shown in FIG. 24 is a relatively long, straight hollow pipe of an electrically conductive material having a length of about 200 mm. A terminal 45 is attached to an end portion of the member 13.

Figure 25:
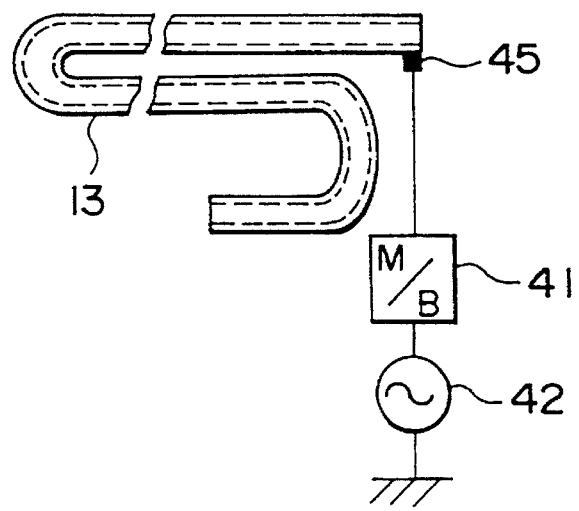
FIG. 25 is a plan view showing a seventh modification of the antenna member used in the third embodiment.

An antenna member 13 shown in FIG. 25 is a U-shaped structure formed by bending a relatively long hollow pipe of an electrically conductive material once or twice. A terminal 45 is attached to an end portion of the member 13.

Figure 26:
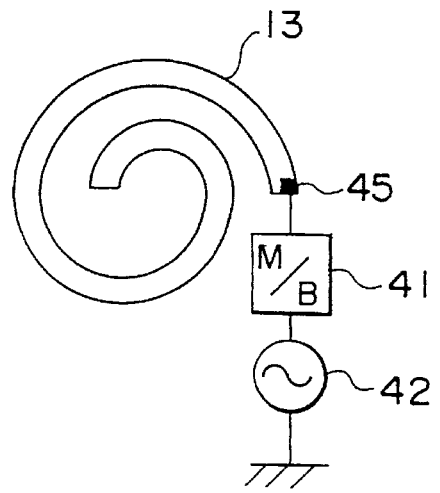
FIG. 26 is a plan view showing an eighth modification of the antenna member used in the third embodiment.

An antenna member 13 shown in FIG. 26 is formed by spirally winding a plate of an electrically conductive material, such as stainless steel, having a width of about 20 mm, one and a half times or nearly twice. A terminal 45 is attached to an end portion of the member 13.

When tests were conducted on the antenna members shown in FIGS. 19 to 26, it was ascertained that a plasma was generated under a pressure as low as 1.0 to $5.0 \times 10^{-6}$ Torr in every case. In these tests, the other end of the radio-frequency power source 42 for plasma generation is connected to the processing chamber 1 and/or the susceptor 2 by shifting the switches 43 and 44. It is to be understood that the inductive and cell couplings are combined in this case.

Even with use of the antenna member 13 shown in FIG. 17 or 19 was used, on the other hand, no plasma was able to be generated under a pressure as low as 1.0 to $5.0 \times 10^{-4}$ Torr when the other end of the radio-frequency power source 42 for plasma generation was connected to neither the processing chamber 1 nor the susceptor 2. Even with the other end of the radio-frequency power source 42 connected to the processing chamber 1 or the susceptor 2, moreover, no plasma was able to be generated under a pressure as low as 1.0 to $5.0 \times 10^{-4}$ Torr when antenna members shown in FIG. 27 to 30 were used.

Figure 27:
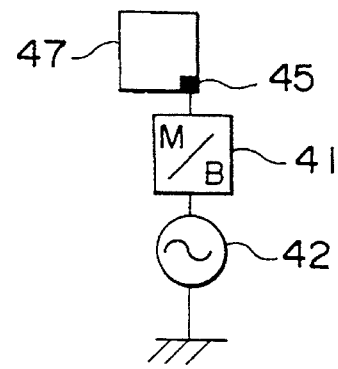
FIG. 27 is a plan view showing an antenna member which cannot generate a plasma in a low-pressure ambience.

An antenna member 47 shown in FIG. 27 is a flat plate of an electrically conductive material measuring about 90 mm by 90 mm. A terminal 45 is attached to one corner of the member 47.

Figure 28:
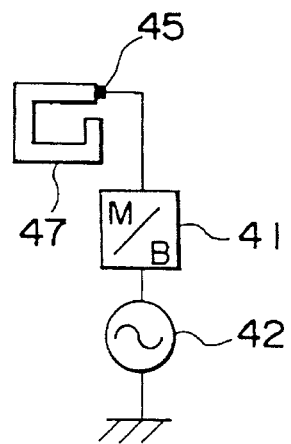
FIG. 28 is a plan view showing another antenna member which cannot generate a plasma in a low-pressure ambience.

An antenna member 47 shown in FIG. 28 is formed by bending a relatively short, narrow stainless-steel plate, for example about 10 cm in width, into a substantially rectangular configuration, for example about 90 mm in length. A terminal 45 is attached to one end portion of the member 47.

Figure 29:
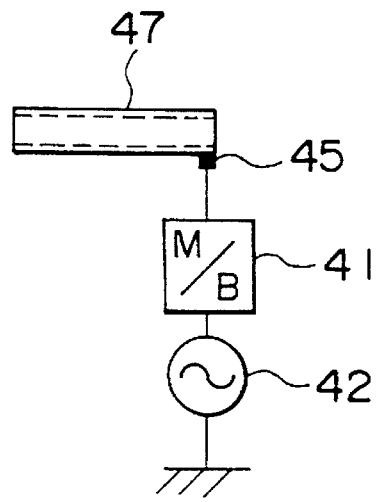
FIG. 29 is a plan view showing still another antenna member which cannot generate a plasma in a low-pressure ambience.

An antenna member 47 shown in FIG. 29 is a relatively short, straight hollow pipe of an electrically conductive material, such as steel, having a length of about 100 mm. A terminal 4b is attached to an end portion of the member 47.

Figure 30:
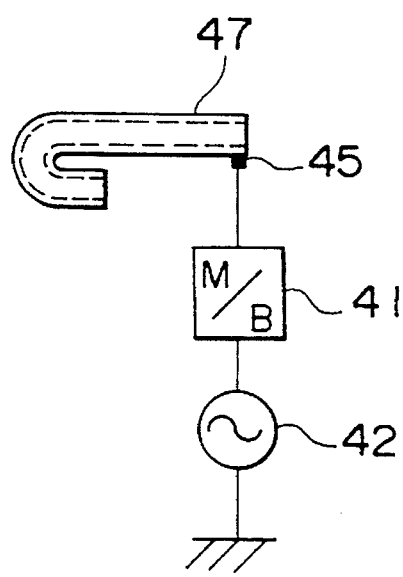
FIG. 30 is a plan view showing a further antenna member which cannot generate a plasma in a low-pressure embience.

An antenna member 47 shown in FIG. 30 is formed by bending an end portion of a relatively short hollow pipe having a length of about 100 mm. A terminal 45 is attached to the other end portion of the member 47.

With use of the antenna members 47 shown in FIGS. 27 to 30, as mentioned before, no plasma was able to be generated under a pressure as low as 1.0 to $5.0 \times 10^{-4}$ Torr.

Figure 31:
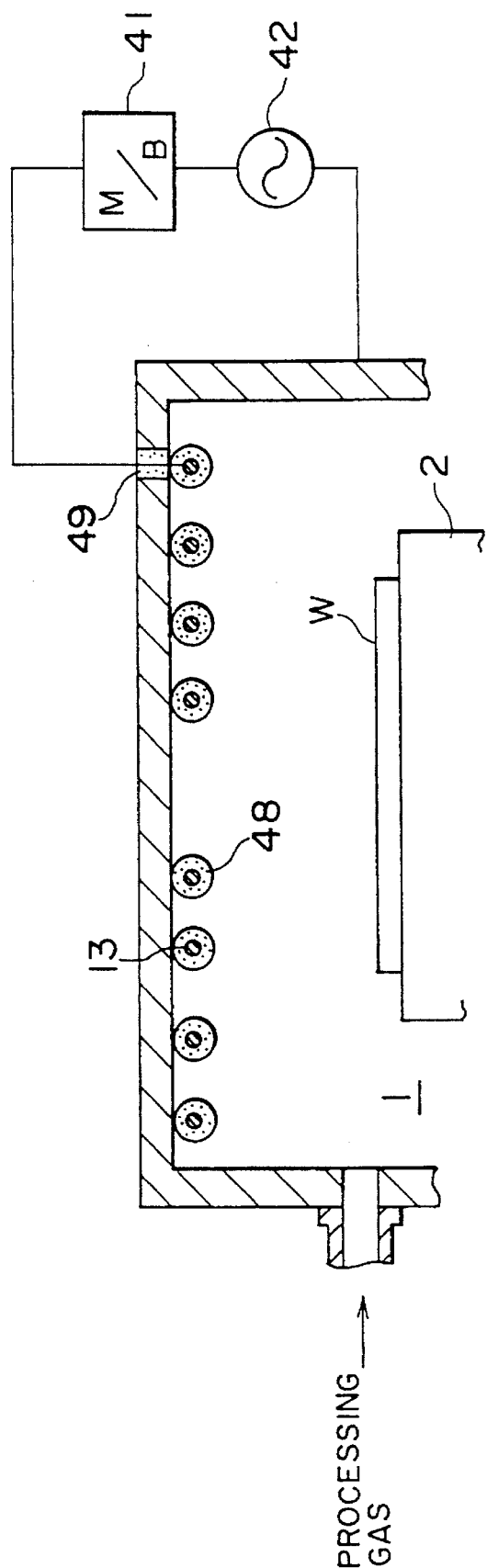
FIG. 31 is a partial sectional view showing a modification of the plasma processing apparatus of the third embodiment.

Although the antenna member 13 is located outside the processing chamber 1 according to the embodiment described above, the present invention is not limited to this arrangement. As shown in FIG. 31, for example, the antenna member 13 may be housed in the processing chamber 1.

In this case, a wire which constitutes the antenna member 13, for example, is covered by an insulator 48 formed of ceramic, polyimide, or silicon carbide for the prevention of metallic pollution. The antenna member 13 of this construction is attached to ceiling of the processing chamber 1. Thus, the ceiling of the chamber 1, like the side wall thereof, must only be integrally formed from, e.g., stainless steel, and the quartz plate 12 shown in FIG. 1 or 17 need not be used.

A feeder from the radio-frequency power source 42 is guided into the processing chamber 1 through an insulator 49 embedded in the ceiling of the chamber 1, and is connected to the antenna member 13.

Since the antenna member 13 is housed in the processing chamber 1 in this manner, the distance between the wafer W and the member 13 is relatively short, so that the efficiency of plasma generation is improved.

Figure 32:
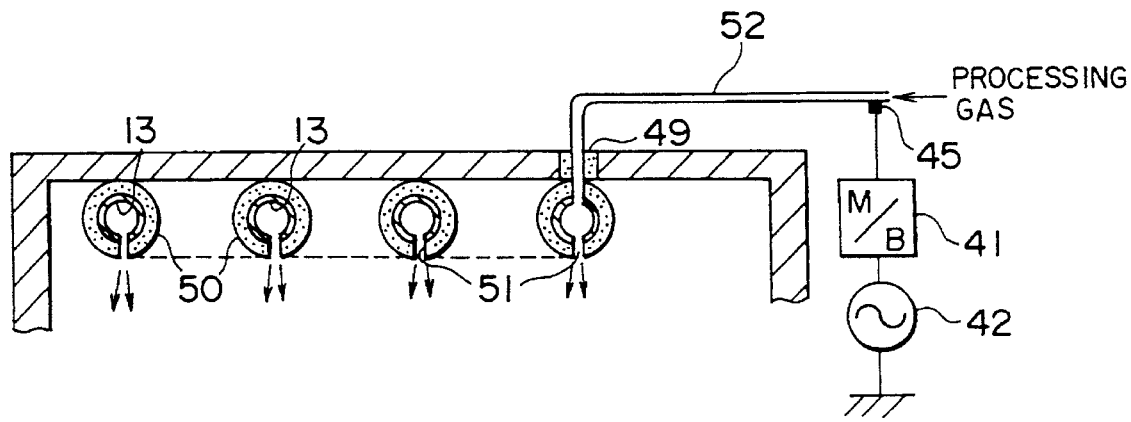
FIG. 32 is a partial sectional view showing another modification of the plasma processing apparatus of the third embodiment.

In a modification shown in FIG. 32, an antenna member 13 is formed of a spiral hollow pipe which is covered by an insulator 50 outside. A number of gas jets 51 are formed penetrating the hollow pipe and the insulator 50. A gas supply pipe 52 formed of a conductor is connected to one end of the spiral hollow pipe through an insulator 49 in the ceiling. The processing gases are introduced into the supply pipe 52, and are fed like a shower into the processing chamber 1 through the gas jets 51.

A terminal 45 is attached to the gas supply pipe 52, and a radio-frequency power source 42 for plasma generation is connected to the terminal 45.

Thus, the antenna member 13 doubles as a processing gas supply head, so that the processing gases can be supplied efficiently.

Figure 33:
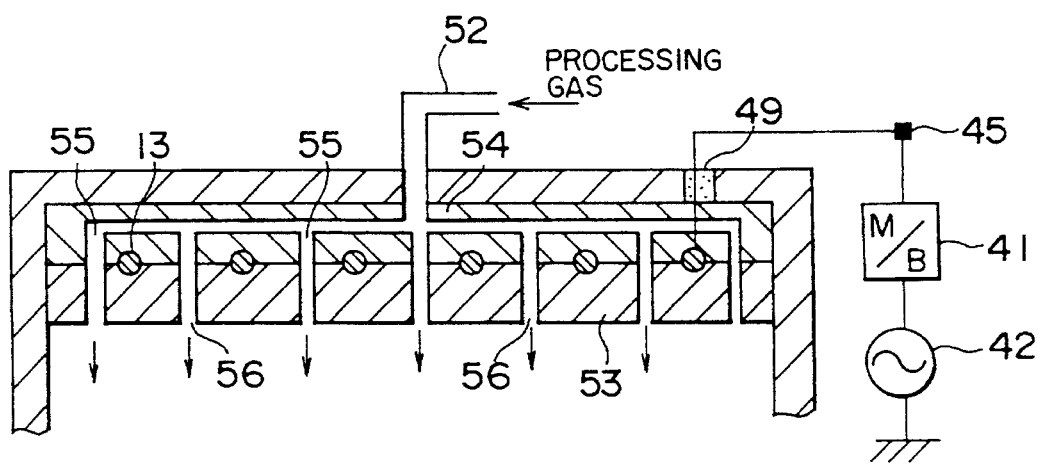
FIG. 33 is a partial sectional view showing still another modification of the plasma processing apparatus of the third embodiment.

In a modification shown in FIG. 33, upper and lower insulating plates 54 and 53 are arranged in the upper part of the interior of the processing chamber 1. A spiral antenna member 13 is sandwiched between the upper and lower plates 54 and 53.

A feeder from a radio-frequency power source 8 is connected to this antenna member 13. A number of gas passages 55 are formed in each of the upper and lower insulating plates 54 and 53. A processing gas supply pipe 52 is connected to the gas passages 55. The lower insulating plate 53 is formed having gas jets 56 through which the gases from the passages 55 are spouted into the processing chamber 1.

Referring now to FIGS. 34 to 38, a plasma processing apparatus according to a fourth embodiment of the prevent invention will be described.

According to the third embodiment described above, a plasma can be generated even in a high vacuum of $1 \times 10^{-6}$ Torr by means of the antenna member which is open at one end. According to the fourth embodiment, plasma density increasing means is provided for increasing the density of the generated plasma. The plasma processing apparatus according to the fourth embodiment specifically corresponds to the plasma film forming apparatuses according to the first to third embodiments. In connection with the fourth embodiment, therefore, a repeated description will be omitted. Alternatively, this plasma processing apparatus may be an etching apparatus or the like.

Figure 34:
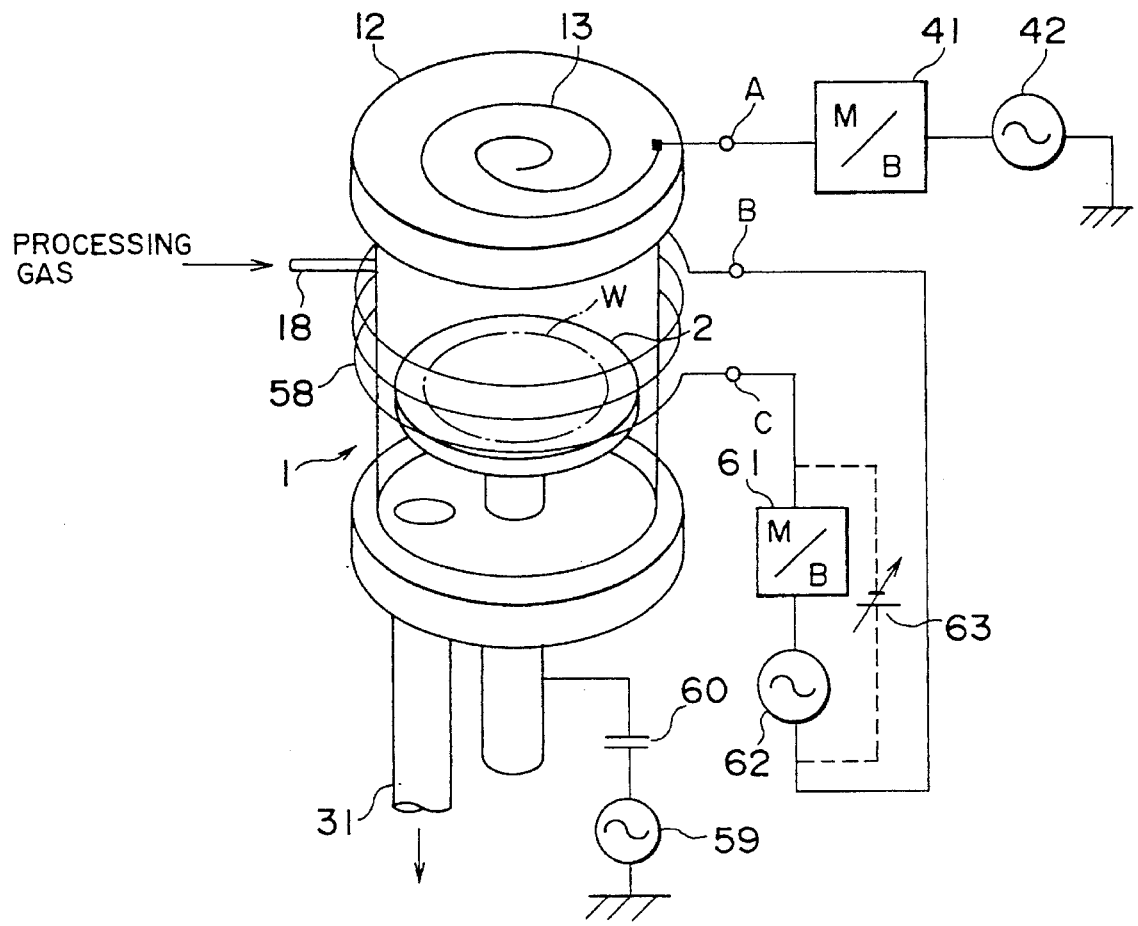
FIG. 34 is a schematic perspective view showing a plasma processing apparatus according to a fourth embodiment of the invention.
Figure 35:
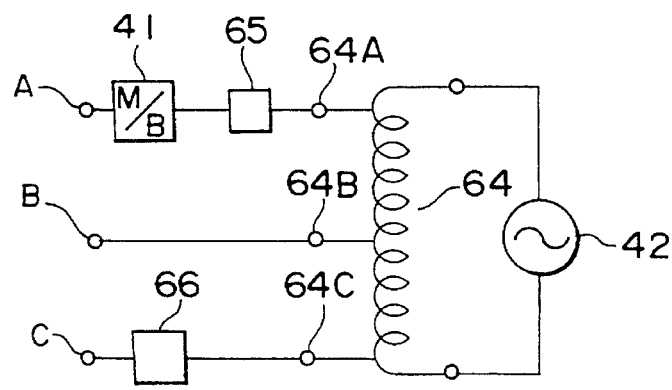
FIG. 35 is a circuit diagram showing an example of a radio-frequency power source applicable to the apparatus of FIG. 34.

FIG. 34 is a schematic perspective view showing the plasma processing apparatus according to the fourth embodiment.

In this plasma processing apparatus, a radio-frequency power source 59 of, e.g., hundreds of kilohertz is connected to a susceptor 2 through a capacitor 60. Thus, active seeds produced by a plasma are attracted to the wafer W.

The plasma density increasing means for increasing the plasma density is located on the side wall of a processing chamber 1. More specifically, the plasma density increasing means comprises a coil 58, wound for a plurality of turns around the side wall of the chamber 1, and an auxiliary radio-frequency power source 62 of, e.g., 13.56 MHz which is connected to terminals B and C at the opposite ends of the coil 58 through a matching circuit 61. The power source 62 is used to apply a radio-frequency voltage across the coil 58. As a result, a plasma is also generated between the coil 58 and the susceptor 2. Thus, the plasma density in the processing chamber 1 can be improved. If the coil 58 used is of the helical resonance type, only electrons can be accelerated by the agency of propagated low-frequency helicon waves, so that the plasma density can be further improved.

In order to generate a plasma efficiently, in this case, the coil 58 should preferably be wound around the whole area of that portion of the side wall which is situated above the susceptor 2.

The following is a description of the operation of the fourth embodiment.

First, the processing gases are caused to flow through a gas inlet pipe 18 as a radio-frequency voltage from a radio frequency power source 42 is applied to an antenna member 13. As a result, radio waves and the like emitted from the antenna member 13 act, so that a plasma is generated even in a high vacuum of $1 \times 10^{-3}$ Torr or below, e.g., at about $1 \times 10^{-6}$ Torr. According to this fourth embodiment, the antenna member 13 serves as a so-called ignition source for the plasma. In this case, the plasma density cannot be increased much with use of only the plasma generated by means of the antenna member 13. Since the plasma density increasing means is attached to the side wall of the processing chamber 1 according to the present embodiment, however, the plasma density can be kept high. Thus, when a radio-frequency voltage from the auxiliary power source 62 is applied to the coil 58 around the side wall, an alternating magnetic field is generated in the processing chamber 1. This alternating magnetic field causes a plasma to be further geometrically generated by the inductive effect of the plasma previously generated by the agency of the antenna member 13. Accordingly, the plasma density in the processing chamber 1 can be increased.

Thus, in the case of etching operation, for example, active seeds and the like produced by plasma discharge excitation are restrained from scattering, so that the wafer surface can be etched with very high anisotropy.

In this case, the plasma density can be increased expressly, so that the anisotropy can be further improved to increase the processing efficiency. According to the present embodiment, the plasma density was able to be adjusted to $1 \times 10^{10}/cm^3$ or above.

In the present embodiment, the frequency of the radio-frequency power source 42 for plasma generation and the auxiliary radio-frequency power source 62 is not limited to 13.56 MHz, and may be set in a wide range from 2 to 50 MHz, for example.

According to the present embodiment, the radio-frequency power source 42 for plasma generation and the auxiliary radio-frequency power source 62 are arranged separately from each other. Alternatively, however, these power sources may be arranged in the manner shown in FIG. 35, for example. In this arrangement, a transformer 64 having three taps 64A, 64B and 64C is connected across the one radio-frequency power source 42. The tap 64A is connected to a terminal A of the antenna member 13 through a matching circuit 41, while the middle tap 64B is connected to the terminal B of the coil 58. The other end tap 64C is connected to the terminal C of the coil 58 through a matching circuit 66.

A phase shifter 65 is disposed in a circuit which is connected to the antenna member 13, whereby the phases of the radio-frequency voltages applied to the antenna member 13 and the coil 58. Thus, the number of radio-frequency power sources can be reduced, so that the manufacturing cost can be lowered.

As shown in FIG. 34, moreover, a variable DC power source 63 may be provided in place of the auxiliary radio-frequency power source 62 and the matching circuit 61 so that a DC voltage can be applied to the coil 58. According to this arrangement, a magnetic field is formed in the processing chamber 1 such that it is directed upward or downward depending on the polarity of the DC power source 63. Accordingly, the plasma generated by means of the antenna member 13 is restricted by this magnetic field, so that it stays in the processing chamber 1 for a longer time, and cannot easily disappear. As a result, the plasma density in the chamber 1 is improved. Preferably, in this case, the voltage of the DC power source 63 should be set in a range from 0 to about 500 volts. When the apparatus is not in use, the application of the DC voltage to the coil 58 is stopped by opening switch means (not shown), whereby the magnetic field can be restrained from influencing peripheral equipment or the like.

Figure 36:
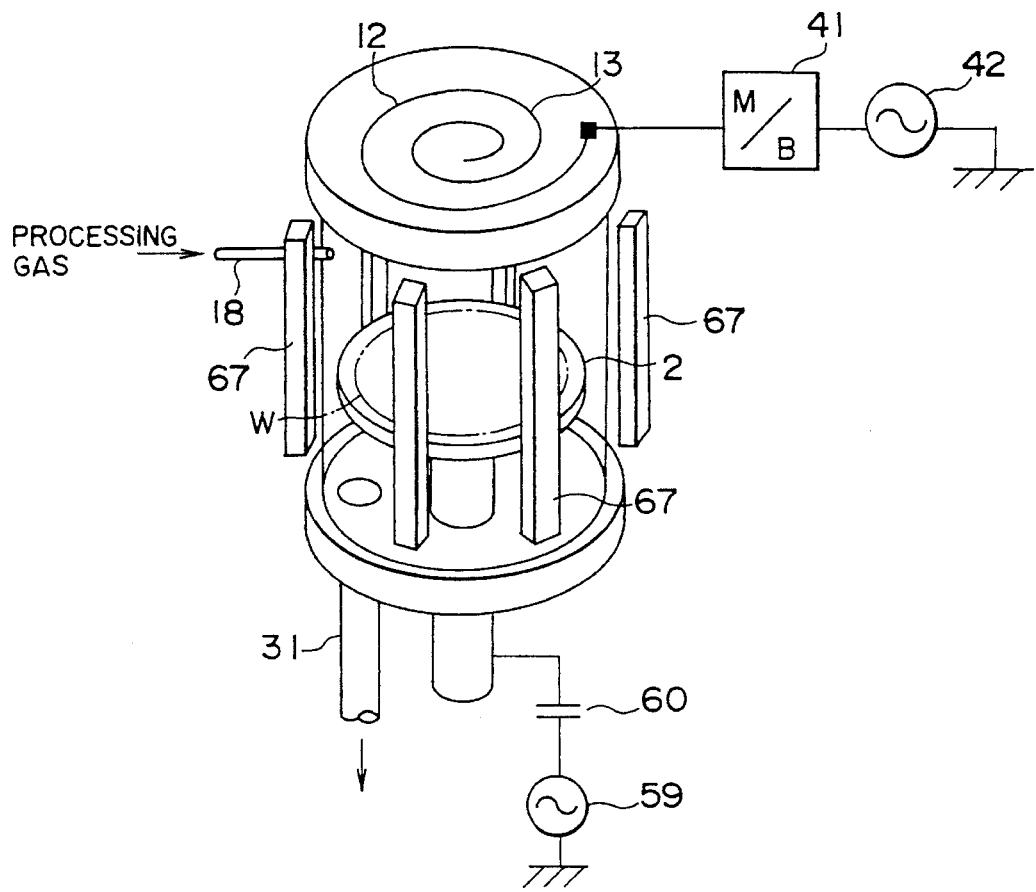
FIG. 36 is a schematic perspective view showing a modification of the embodiment of FIG. 35.
Figure 37:
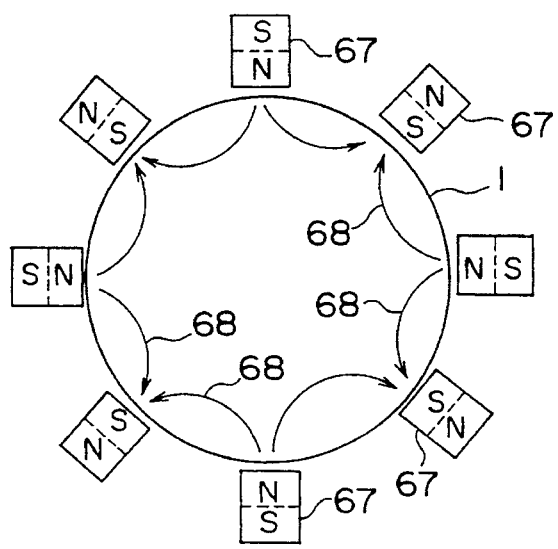
FIG. 37 is a diagram illustrating an array of permanent magnets of the apparatus shown in FIG. 36.

In the present embodiment, the plasma density increasing means is composed of the auxiliary radio-frequency power source 62 or the DC power source 63 and the coil 58 connected thereto. Alternatively, however, the density increasing means may be arranged in the manner shown in FIGS. 36 and 37. FIGS. 36 and 37 show a modification of the fourth embodiment. In this modification, a plurality of permanent magnets 67, which are arranged outside the side wall of the processing chamber 1, are used in place of the coil 58 and the auxiliary radio-frequency power source 62, as the plasma density increasing means.

More specifically, each permanent magnet 67 is in the form of a rod which extends in the height direction of the processing chamber 1. In the illustrated example, eight permanent magnets 67 are arranged at regular intervals in the circumferential direction of the side wall of the chamber 1. The magnets 67 are not limited to eight in number.

Also, the respective north or south poles of the permanent magnets 67 are arranged along the side wall of the processing chamber 1. Moreover, the magnets 67 are oriented alternately with respect to the center of the chamber 1 so that each two adjacent magnets 67 are different in polarity.

Thus, the permanent magnets 67, for use as the plasma density increasing means, generates a strong magnetic field 68 which is defected from the north poles of the magnets to the sourth poles in the processing chamber 1. The plasma generated in high vacuum by means of the antenna member 13 is confined to the processing chamber 1 by the agency of the magnetic field 68, so that it is restrained from being dissipated. The larger the magnetic field 68, the greater this effect is. Preferably, the intensity of the magnetic field should be adjusted to 5 gauss or more in a high vacuum of, e.g., $1 \times 10^{-6}$ Torr.

As the plasma is thus confined by the effect of the magnetic field 68, the plasma density can be kept pretty high even under a pressure as low as $1 \times 10^{-6}$ Torr, so that etching can be effected with very high anisotropy.

The following is a description of another modification of the fourth embodiment.

Figure 38:
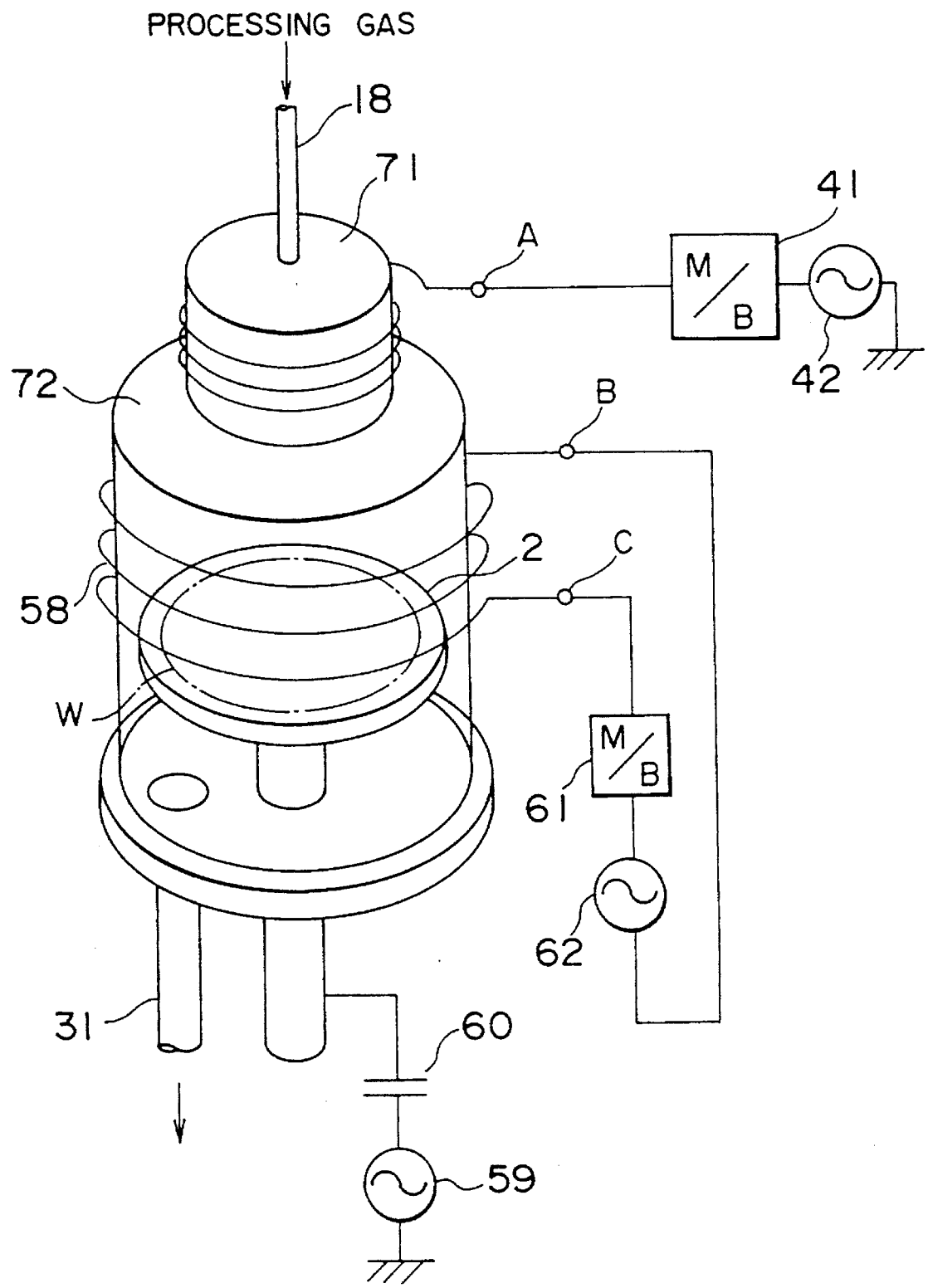
FIG. 38 is a schematic perspective view showing another modification of the fourth embodiment.

FIG. 38 shows the second modification of the fourth embodiment. In this modification, the plasma density increasing means is constructed in the same manner as the one shown in FIG. 34 except for the respective shapes of the processing chamber 1 and the antenna member 13.

More specifically, the processing chamber comprises a small-capacity first compartment 71 formed of a dielectric, such as quartz, and having the shape of, e.g., a bell jar, and a large-capacity second compartment 72 connected to the bottom of the first compartment 71.

The second compartment 72, which serves as the processing chamber, contains a susceptor assembly 2 therein. The side wall of the compartment 72 is fitted with the plasma density increasing means including a coil 58 of, e.g., the helical resonance type and an auxiliary radio-frequency power source 62, which are constructed in the same manner as the ones shown in FIG. 34.

Moreover, the antenna member 13 formed a linear medium is spirally wound for a plurality of turns around the side wall of the first compartment 71. One end of the member 13 is an open end, while the other end thereof is connected with a radio-frequency power source 42 for plasma generation through a matching circuit 41. A gas supply pipe 18 for supplying processing gases and the like is connected to the ceiling of the first compartment 71. The processing gases introduced through the pipe 18 are converted into a plasma even in a low-pressure ambience of about $1 \times 10^{-6}$ Torr by the effect of electromagnetic waves from the antenna member 13.

The generated plasma moves into the second or lower compartment 72, and a radio-frequency voltage of, e.g., 13.56 MHz is applied across a coil 58 which is wound around the side wall of the chamber 72. Induced by the plasma from the first or upper compartment 71, therefore, the processing gases and the like are also excited in the second compartment 72, so that the plasma generation is accelerated. Thus, the plasma generated in the first compartment 71 is fed into the second compartment 72 which cannot easily generate a plasma under a low pressure of $1 \times 10^{-3}$ Torr or below by itself. Accordingly, a plasma can be also generated in the second compartment 72. In consequence, the plasma density in the processing chamber 1 can be extremely increased even under a pressure as low as $1 \times 10^{-6}$ Torr, so that etching can be effected with very high anisotropy, for example.

When the pressure in the first compartment 71 is made a little higher than the pressure in the second compartment 72, in this case, the plasma and active seeds generated in the first compartment 71 can be smoothly transferred to the second compartment 72. On the other hand, the plasma and the like generated in the second compartment 72 can be prevented from flowing back into the first compartment 71, so that the plasma density can be further improved.

Since the different radio-frequency power sources 42 and 62 are used as energy sources for the antenna member 13 and the coil 58 thereunder, moreover, they can be controlled independently of each other, so that fine plasma control can be enjoyed.

According to the present embodiment, furthermore, a variable DC power source may be used in place of the auxiliary radio-frequency power source 62 and the matching circuit 61 which are connected to the coil 58, as described in connection with the arrangement shown in FIG. 34. Alternatively, a plurality of permanent magnets 67, which are arranged in the same manner as the ones described with reference to FIGS. 36 and 37, may be used in place of the coil 58 and the auxiliary radio-frequency power source 62, as the plasma density increasing means.

Although the plasma CVD apparatus has been described also in connection with the fourth embodiment, the present invention is not limited to this apparatus, and may be applied to any other plasma processing apparatus, e.g., a plasma etching apparatus.

Referring now to FIGS. 39 to 41, a plasma film forming method and apparatus according to a fifth embodiment of the present invention will be described.

Generally, in the manufacture of a semiconductor device such as a semiconductor integrated circuit, the surface of a semiconductor wafer substrate is filmed and etched repeatedly. Accordingly, transistors, resistors, capacitors, and other element, and wires connecting these elements, and the like are formed in a plane configuration.

Recently, there have been demands for semiconductor devices of higher density, finer design, and smaller size. As a measure to meet these demands, there is a proposal that the semiconductor elements and the like should be arranged in two or more layers on the wafer so that their mounting area is reduced.

If the semiconductor device has such a multilayer structure, layer insulating films between metal wires should be formed as level as possible in order to improve the quality of the films and restrain snapping of the upper-layer wires.

Referring now to FIGS. 40A to 40E, a conventional semiconductor film leveling method will be described. In FIG. 40A, symbol W denotes a wafer, and various elements (not shown) are formed in a plane configuration on the surface of the wafer W. A metal wiring pattern of, e.g., aluminum is formed on the elements. In this case, depressions 84 are formed like troughs between wires 82. In the illustrated example, only one of the depressions 84 is shown for simplicity.

As shown in FIG. 40B, a P-SiO$_2$ film (silicon oxide film by plasma) 86 is accumulated by plasma CVD (chemical vapor deposition) using SiH$_4$ (silane) and the like as processing gases. Conventionally, in this case, even if the apparatus is parallel flat plate type, the lower limit of the processing pressure of the plasma CVD is about $1 \times 10^{-2}$ Torr, and no plasma can be generated under a lower pressure. If the processing pressure is relatively low, therefore, a deposit film on a bottom portion 88 of the depression 84 is thinner than one on the side wall of the depression 84 due to scattering of particles and ions and the like. As a result, a void 90 is produced. If plasma CVD operation is carried out to an excessive degree in this state, the opening of the void 90 will be closed, as shown in FIG. 41. In consequence, a hollow 92 will be produced, so that the insulating film quality will be too low to ensure satisfactory insulating properties.

Accordingly, the plasma CVD operation is finished before the opening of the void 90 is closed. Then, the wafer W is spun as organic or inorganic liquid glass is dripped thereon, as shown in FIG. 40C. Thus, an SOG (spin-on-glass) film 94 is formed uniformly. At this time, the liquid glass penetrates the void 90 to fill it.

Since the SOG is liquid, its step coverage is better than that of P-SiO$_2$. Since it contains water (OH groups), however, the SOG film is not suited for use in a semiconductor integrated circuit.

As shown in FIG. 40D, therefore, the surface of the SOG film 94 is mechanically leveled by scraping, that is, all the film 94 except the portion in the void 90 is removed. A P-SiO$_2$ film 96 is formed on the resulting structure by plasma CVD again, as shown in FIG. 40E. Thus, the SOG in the void 90 is confined by the P-SiO$_2$ film 96, so that the OH groups can be prevented from leaking out. In this manner, the layer insulating films between the metal wires are fabricated.

Thereafter, second, third, and further wiring patterns are stacked for lamination in like manner.

According to the conventional semiconductor film leveling method described above, however, the P-SiO$_2$ and SOG films are formed repeatedly, and the SOG film 94 must be scraped off. In consequence, this method requires a great many processes of operation, thus entailing higher costs.

Since the P-SiO$_2$ and SOG films must be formed by means of different processing apparatuses, moreover, wafers are expected to be transferred, and the throughput is lowered.

Although the SOG in the void 90, containing water, is confined by the P-SiO$_2$ film 96, the OH groups may possibly leak from it, so that the film quality may be lowered in reliability.

The object of the fifth embodiment is to provide a semiconductor film leveling method in which a film formed on the surface of an object of processing by means of a plasma is leveled by ion sputtering in case depressions cannot be filled with the film.

The plasma CVD apparatus according to any of the first to fourth embodiments are used in the film formation according to the fifth embodiment. A description of the CVD apparatus will be omitted.

Figure 39A:
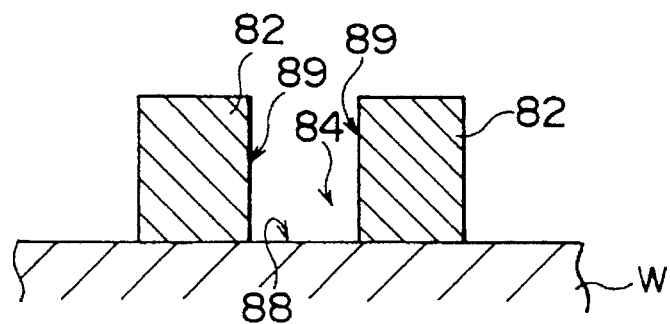
FIGS. 39A, 39B, 39C and 39D are diagrams for illustrating an example of a semiconductor film forming method according to a fifth embodiment.

As shown in FIG. 39A, a projecting metal wiring pattern of, e.g., aluminum is formed on a wafer W, and a depression 84 is formed between wires 82.

As shown in FIG. 1, processing gases, e.g., silane gas, oxygen, etc., are fed into the processing chamber 1, and the interior of the chamber 1 is kept under a processing pressure as low as about $1 \times 10^{-3}$ Torr. At the same time, radio-frequency power of 13.56 MHz is applied to an antenna member 13 at the power level of 100 watts, for example, by means of a radio-frequency power source 15 for plasma generation and the like.

In this case, the flow rates of silane gas and oxygen are adjusted to, for example, 40 SCCM and 80 SCCM, respectively. The wafer W is heated to a temperature such that the aluminum wires 82 cannot be melted, e.g., to 400° C. or below.

No voltage from a radio-frequency power source 10 is applied to a susceptor 2, so that the potential of the susceptor 2 is rendered floating.

Figure 39B:
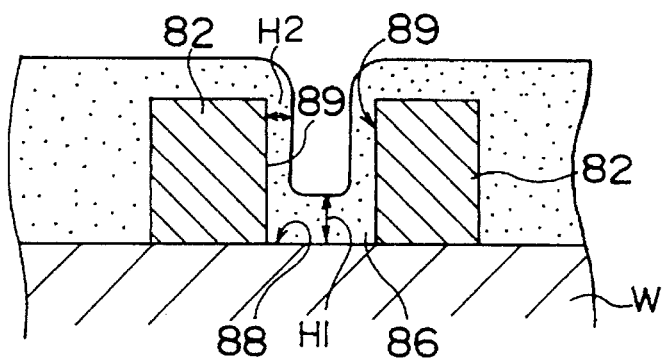

When a radio-frequency voltage is supplied from the radio-frequency power source 15 for plasma generation, radio waves are emitted toward the interior of the processing chamber 1 by the inductive action of the inductance component of the antenna member 13. At the same time, an alternating electric field is generated in the chamber 1 by the agency of a capacitive component between the member 13 and the chamber 1. As a result, the processing gases are ionized to form a plasma even in a high vacuum of $1 \times 10^{-3}$ Torr, whereupon a silicon oxide (P-SiO$_2$) film 86 is formed by means of the plasma, as shown in FIG. 39B. The plasma in such a high vacuum is highly dense, so that a depression 84 with a high aspect ratio can be filled, as shown in FIG. 39B.

According to the CVD using the high-density plasma under such a low pressure, the thickness H1 of a deposit film on a bottom portion 88 of the depression 84 is relatively great. On the other hand, the thickness H2 of a deposit film on the side wall of the depression 84 is relatively small. Thus, the ratio (H1/H2) between these thickness is one or more, and the depression 84 can be filled without involving a void. The filled portion has an anisotropic configuration, as shown in FIG. 39C.

Figure 39C:
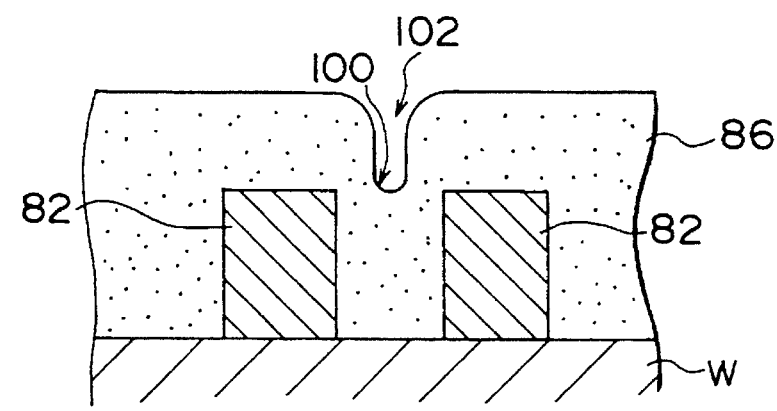

The depression 84 is thus filled by the plasma CVD to a height such that the top of the metal wires 82 is overreached by a bottom 100 of the deposit portion of the P-SiO$_2$ film, as shown in FIG. 39C. In consequence, a deposit depression 102 corresponding to the depression 84 between the metal wires 82 is formed on the surface of the deposit portion of the P-SiO$_2$ film.

When a predetermined time of plasma CVD operation terminates in this manner, sputter CVD is then started. In doing this, a negative bias voltage of, e.g., −200 volts from the radio-frequency power source 10 for bias application is applied to the susceptor 2, whereupon sputter CVD operation is initiated. In this case, the processing conditions, including the processing gases, processing pressure, processing temperature, etc., are used as in the case of the plasma CVD in the preceding stage. The silane gas and oxygen for use as the processing gases may be replaced with argon (Ar) gas which is supplied at a flow rate of, e.g., about 50 SCCM.

Figure 39D:
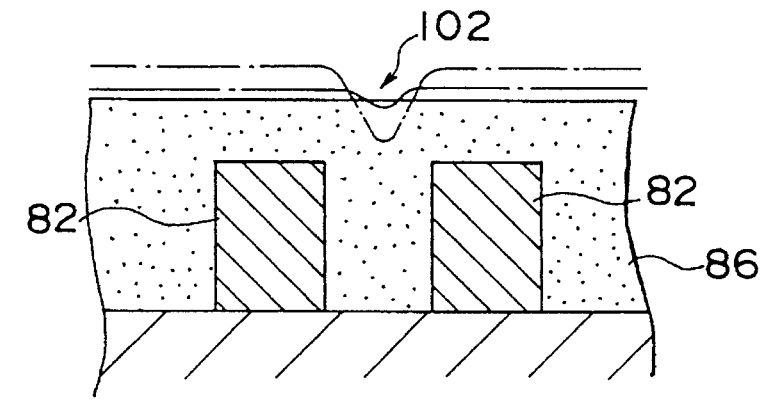

When the sputter CVD operation is performed in this manner, high-energy ions from the plasma are applied to the surface of the P-SiO$_2$ film. The applied ions selectively scrape off the side wall of the deposit depression 102 of the P-SiO$_2$ film and a corner portion between the sidewall and the flat portion. At the same time, part of the scraped oxide (P-SiO$_2$) film adheres to the bottom 100 of the deposit depression 102. Thus, the bottom 100 is buried, so that the deposit film is finally leveled, as shown in FIG. 39D. As the sputtering process advances, the deposit depression 102 is gradually filled so that the whole surface is leveled, as indicated by dashed line and two-dot chain line in FIG. 39D. Thereupon, the filling operation for the depression 84 on the surface of the wafer W is finished.

In manufacturing a multilayer IC, elements and wires for the second and third layers are formed on the leveled insulating layer, and are leveled in the same manner as aforesaid.

Thus, according to the present embodiment, the oxide film is accumulated to some degree by plasma CVD in a high vacuum which provides an aspect ration (H1/H2) of 1 or more. Thereafter, a negative bias is applied to the susceptor 2, and the deposit film is leveled by sputter CVD. Thus, the leveling can be effected with use of only the plasma-induced oxide film (P-SiO$_2$) of good quality. It is unnecessary, therefor, to use the SOG film of poorer quality, which has conventionally been used, so that the quality of the entire film can be improved considerably. In consequence, a layer insulating film can be formed having high insulating properties for aluminum electrodes and the like.

As mentioned before, moreover, the deposition and leveling of the oxide film can be carried out in one and the same processing apparatus, and also, the processes of forming and cutting the SOG film can be omitted, so that the number of processes of operation can be reduced considerably. Thus, the throughput can be improved, and besides, the costs can be reduced.

Although the processing pressure is adjusted to about $1\times10^{-3}$ Torr according to the embodiment described above, it may be adjusted to any level lower than a pressure such that the aspect ratio (H1/H2) for the plasma CVD operation is 1 or more, e.g., $1\times10^{-2}$ Torr.

In the embodiment described above, silane gas and oxygen are used as the processing gases. Alternatively, however, other silane-based gases or a combination of TEOS, oxygen, etc. may be used for the purpose Moreover, the radio-frequency power source 10 is used as a power source for bias application during plasma sputtering operation. Alternatively, however, a DC power source of, e.g., −200 volts may be used.

According to the above-described embodiment, furthermore, the P-SiO$_2$ film is formed. However, the present invention is not limited to the formation of this film, and may be also applied to the formation of other films, such as a TiN film, SiN film, etc. In forming a TiN film, for example, alkylated Ti and hydrazine as a reducing agent may be used.

The following is a description of the output of the power source for bias application for sputter CVD. The following tests were conducted on the output of this power source.

Figure 42:
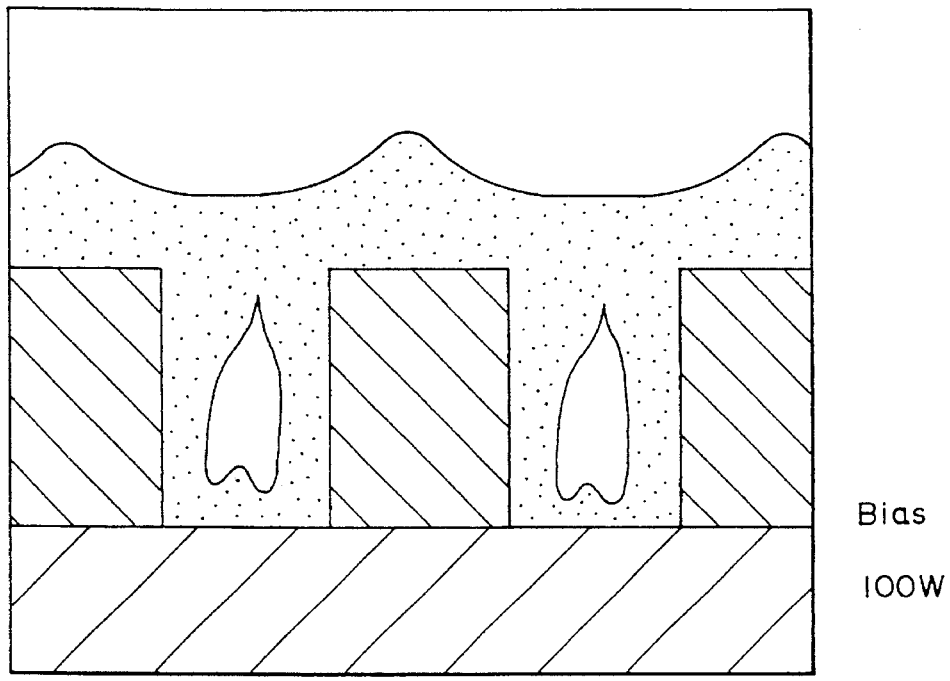
FIG. 42 is a diagram showing the result of a test on the power of a radio-frequency power source for bias application.
Figure 43:
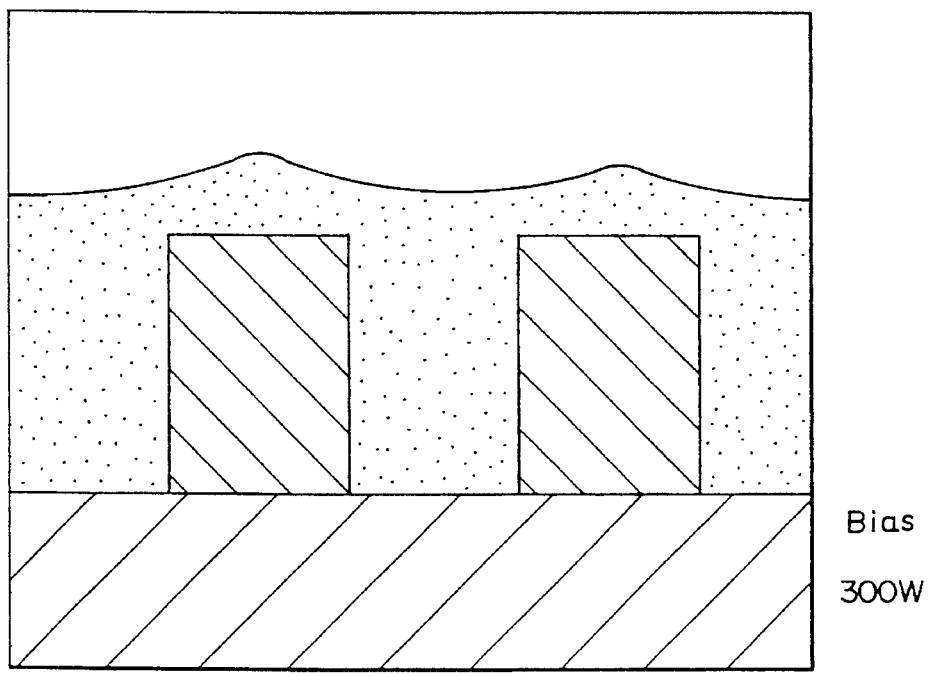
FIG. 43 is a diagram showing the result of another test on the power of the radio-frequency power source for bias application.
Figure 44:
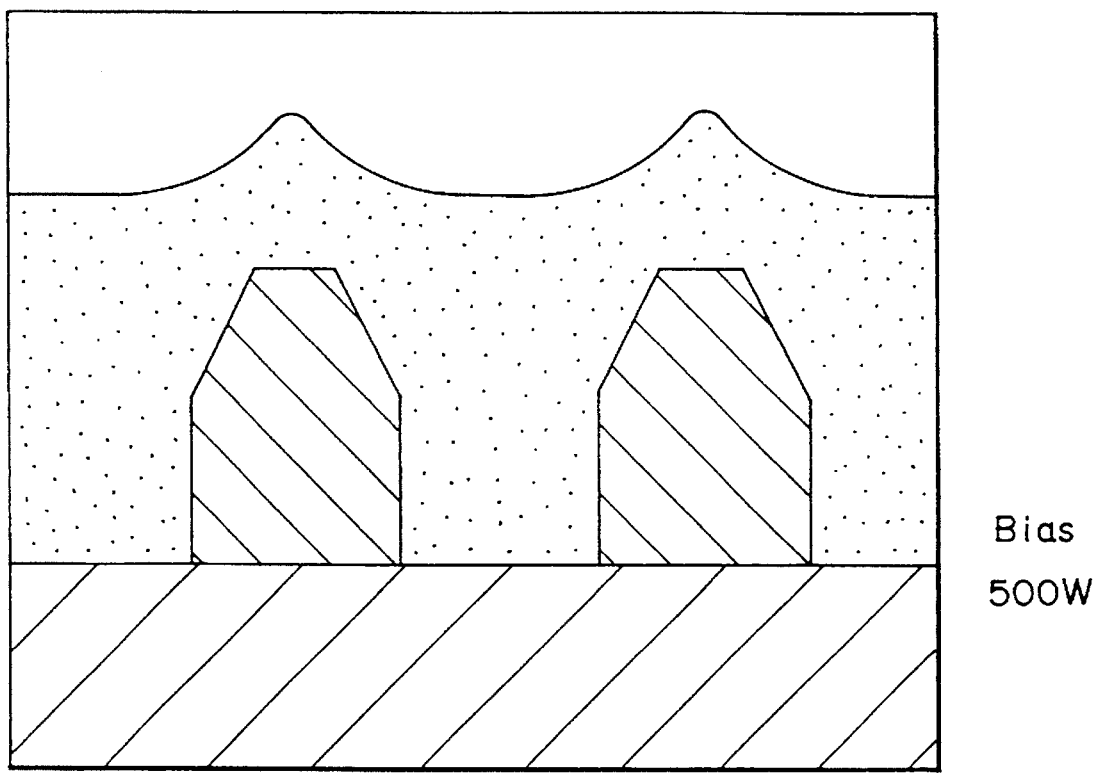
FIG. 44 is a diagram showing the result of still another test on the power of the radio-frequency power source for bias application.

Test pieces are 5-inch silicon wafers, whose specifications are given as follows.
TEOS: 10 SCCM
O$_2$: 20 SCCM
Ar: 25 SCCM
Substrate Temperature: R.T.
RF Power (13.56 MHz): 600 W
Nozzle: 100 mm
Gap: 105 mm
Total Pressure: 20 mTorr
Bias RF Power (400 kHz): 100 to 500 W In these tests, outputs of 100, 300, and 500 watts were given to the radio-frequency power source 10 (FIG. 1) for bias application. FIGS. 42, 43 and 44 shows tests results for the cases of the outputs of 100, 300, and 500 watts, respectively.

Voids were produced in the case of the output of 100 watts shown in FIG. 42, while the wires were shaved in the case of the output of 500 watts shown in FIG. 44. In the case of the output of 300 watts shown in FIG. 43, each depression was entirely filled by the SiO$_2$ film. If the output of the radio-frequency power source for bias application is low, as seen from these test results, sputter CVD cannot produce a satisfactory effect of sputtering, and the side wall of the depression is not shaved by sputtering. If the output of this radio-frequency power source is high, on the other hand, it is believed that the effect of sputtering is so great that even the wires are shaved. Thus, there is correlation between the output of the radio-frequency power source for bias application and the sputtering effect, and the power source output should be kept within a predetermined range.

Although the plasma film forming apparatuses and plasma processing apparatuses have been described as illustrative examples of plasma CVD apparatuses in connection with the first to fifth embodiments, the present invention is not limited to these apparatuses, and may be also applied to plasma sputtering, plasma etching, etc.

What is claimed is:

1. A plasma processing apparatus comprising:

a mount for carrying an object for processing in an airtight processing chamber;

a flat coil opposed to the mount and having one end connected to nothing, a middle portion connected to nothing, and another end, the diameter of the flat coil being larger than that of the object of processing; and application means for applying radio-frequency power to said another end of the coil and the mount or a container in the processing chamber, a plasma being generated such that plasma processing is effected through reaction or ions or active seeds in the plasma.

2. A plasma processing apparatus according to claim 1, wherein said coil is located adjacent to the outer wall of the processing chamber, that part of the outer wall which adjoins the coil being formed of a dielectric.

3. A plasma processing apparatus according to claim 1, further comprising pressure regulating means for keeping the pressure in the processing chamber within a range from $10^{-6}$ Torr to 10 Torr.

4. A plasma processing apparatus comprising:

a mount for carrying an object for processing in an airtight processing chamber;

a flat coil opposed to the mount and having one end connected to nothing, a middle portion connected to nothing, and another end, the diameter of the flat coil being larger than that of the object of processing;

application means for applying radio-frequency power to said another end of the coil and the mount or a container in the processing chamber, a plasma being generated such that plasma processing is effected through reaction or ions or active seeds in the plasma, and plasma density increasing means, arranged radially outside the outer wall of the processing chamber, for increasing the density of the plasma in the processing chamber.

5. A plasma processing apparatus according to claim 4, wherein said plasma density increasing means includes:

a coil wound radially outside the outer wall of the processing chamber; and an auxiliary radio-frequency power source connected to the coil.

6. A plasma processing apparatus according to claim 4, wherein said plasma density increasing means includes:

a coil wound radially outside the outer wall of the processing chamber; and a DC power source connected to the coil.

7. A plasma processing apparatus according to claim 4, wherein said plasma density increasing means includes:

a permanent magnet radially outside the outer wall of the processing chamber.

8. A plasma processing apparatus comprising:

a mount for carrying an object for processing in an airtight processing chamber;

a flat coil opposed to the mount and having one end connected to nothing, a middle portion connected to nothing, an another end, the diameter of the flat coil being larger than that of the object of processing, the flat coil being accommodated in the processing chamber; and application means for applying radio-frequency power to said another end of the coil and the mount or a container in the processing chamber, a plasma being generated such that plasma processing is effected through reaction or ions or active seeds in the plasma.

9. A plasma processing apparatus according to claim 8, wherein said flat coil is formed of a spiral hollow which is covered by an insulator outside and through which the gas is introduced into the processing chamber.

10. A plasma processing apparatus according to claim 8, wherein said flat coil is sandwiched between upper and lower plates which are arranged in the upper part of the interior of the processing chamber.

\* \* \* \* \*